(12) United States Patent
Tsunoda et al.

(10) Patent No.: US 6,982,194 B2
(45) Date of Patent: Jan. 3, 2006

(54) SEMICONDUCTOR DEVICE AND METHOD FOR MANUFACTURING THE SAME

(75) Inventors: Akira Tsunoda, Kanagawa (JP); Shunpei Yamazaki, Setagaya (JP); Jun Koyama, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 10/125,790

(22) Filed: Apr. 19, 2002

(65) Prior Publication Data

US 2003/0164500 A1 Sep. 4, 2003

Related U.S. Application Data

(63) Continuation-in-part of application No. 10/105,625, filed on Mar. 26, 2002.

(30) Foreign Application Priority Data

| Mar. 27, 2001 | (JP) | ........................................ | 2001-091493 |
| Mar. 27, 2002 | (JP) | ........................................ | 2002-089062 |

(51) Int. Cl.
*H01L 21/84* (2006.01)

(52) U.S. Cl. ...................... 438/157; 438/158; 438/163; 438/166; 438/482

(58) Field of Classification Search ................. 438/157, 438/158, 163, 166, 482
See application file for complete search history.

(56) References Cited

U.S. PATENT DOCUMENTS

| 3,823,349 A | 7/1974 | Dhaka et al. |
| 4,748,485 A | 5/1988 | Vasudev |
| 4,954,855 A | 9/1990 | Mimura et al. |
| 5,017,983 A | 5/1991 | Wu |
| 5,053,354 A | 10/1991 | Tanaka et al. |
| 5,075,674 A | 12/1991 | Katayama et al. |
| 5,079,606 A | 1/1992 | Yamamura et al. |
| 5,140,391 A | 8/1992 | Hayashi et al. |
| 5,188,973 A | 2/1993 | Omura et al. |
| 5,273,921 A | 12/1993 | Neudeck et al. |
| 5,323,042 A | 6/1994 | Matsumoto |
| 5,338,959 A | 8/1994 | Kim et al. |
| 5,339,181 A | 8/1994 | Kim et al. |
| 5,367,180 A | 11/1994 | Asai et al. |
| 5,371,398 A | 12/1994 | Nishihara |
| 5,396,084 A | 3/1995 | Matsumoto |
| 5,430,320 A | 7/1995 | Lee |
| 5,444,282 A | 8/1995 | Yamaguchi et al. |
| 5,461,419 A | 10/1995 | Yamada |
| 5,468,987 A | 11/1995 | Yamazaki et al. |
| 5,495,119 A | 2/1996 | Ikeuchi |
| 5,497,019 A | 3/1996 | Mayer et al. |

(Continued)

*Primary Examiner*—David Nelms
*Assistant Examiner*—Mai-Huong Tran
(74) *Attorney, Agent, or Firm*—Eric J. Robinson; Robinson Intellectual Property Law Office, P.C.

(57) ABSTRACT

A semiconductor device, comprises a first electrode, a semiconductor film, a first insulating film and a second insulating film formed between the semiconductor film and the first electrode, a second electrode, and a third insulating film formed between the semiconductor film and the second electrode. The semiconductor film is formed on a flat surface of the second insulating film. A cross portion where the first electrode and the second electrode cross the semiconductor film at the same position is formed. The first electrode and the second electrode are connected to each other through an opening made in the first insulating film and the second insulating film outside the cross portion.

6 Claims, 17 Drawing Sheets

U.S. PATENT DOCUMENTS

| | | | | |
|---|---|---|---|---|
| 5,567,959 | A | 10/1996 | Mineji | |
| 5,616,944 | A | 4/1997 | Mizutani et al. | |
| 5,643,826 | A | 7/1997 | Ohtani et al. | |
| 5,644,147 | A | 7/1997 | Yamazaki et al. | |
| 5,672,888 | A | 9/1997 | Nakamura | |
| 5,801,397 | A | 9/1998 | Cunningham | |
| 5,808,595 | A | 9/1998 | Kubota et al. | |
| 5,818,070 | A | 10/1998 | Yamazaki et al. | |
| 5,835,177 | A | 11/1998 | Dohjo et al. | |
| 5,879,969 | A | 3/1999 | Yamazaki et al. | |
| 5,917,225 | A | 6/1999 | Yamazaki et al. | |
| 5,923,962 | A | 7/1999 | Ohtani et al. | |
| 5,923,963 | A * | 7/1999 | Yamanaka | 438/157 |
| 6,198,133 | B1 | 3/2001 | Yamazaki et al. | |
| 6,252,248 | B1 | 6/2001 | Sano et al. | |
| 6,326,642 | B1 | 12/2001 | Yamazaki et al. | |
| 6,327,006 | B1 | 12/2001 | Sato et al. | |
| 6,342,717 | B1 | 1/2002 | Komatsu | |
| 6,380,011 | B1 | 4/2002 | Yamazaki et al. | |
| 6,383,904 | B1 | 5/2002 | Yu | |
| 6,493,046 | B1 * | 12/2002 | Ueda | 349/38 |
| 6,504,173 | B2 | 1/2003 | Hsu et al. | |
| 6,555,420 | B1 | 4/2003 | Yamazaki | |
| 6,583,828 | B1 * | 6/2003 | Wada et al. | 349/39 |
| 6,624,450 | B1 | 9/2003 | Yamazaki et al. | |
| 6,639,246 | B2 | 10/2003 | Honda | |

* cited by examiner

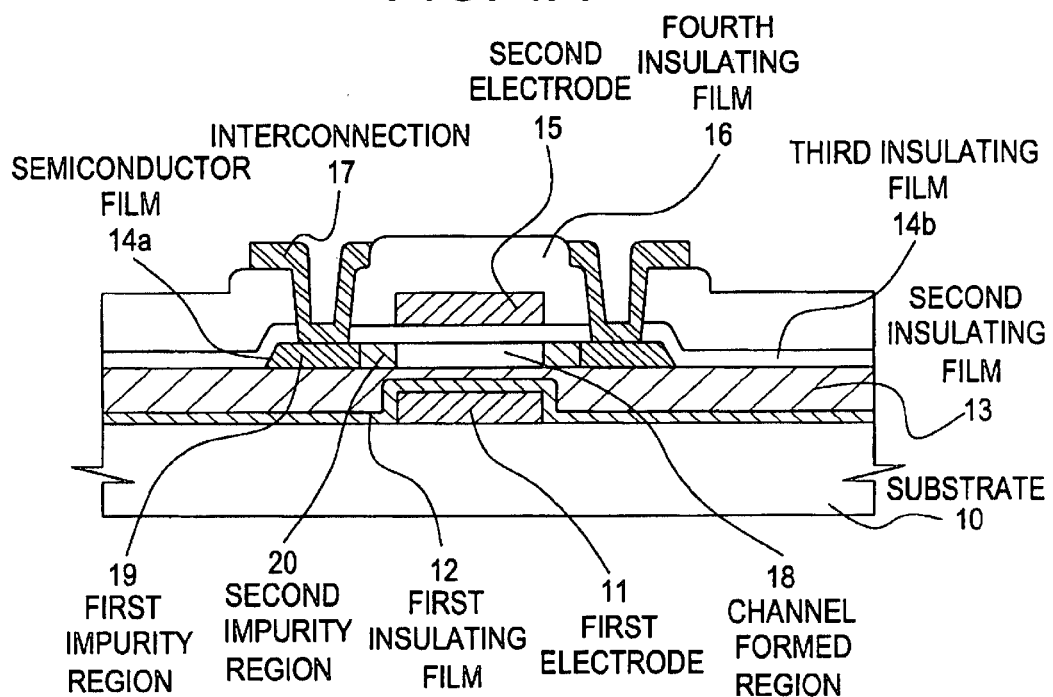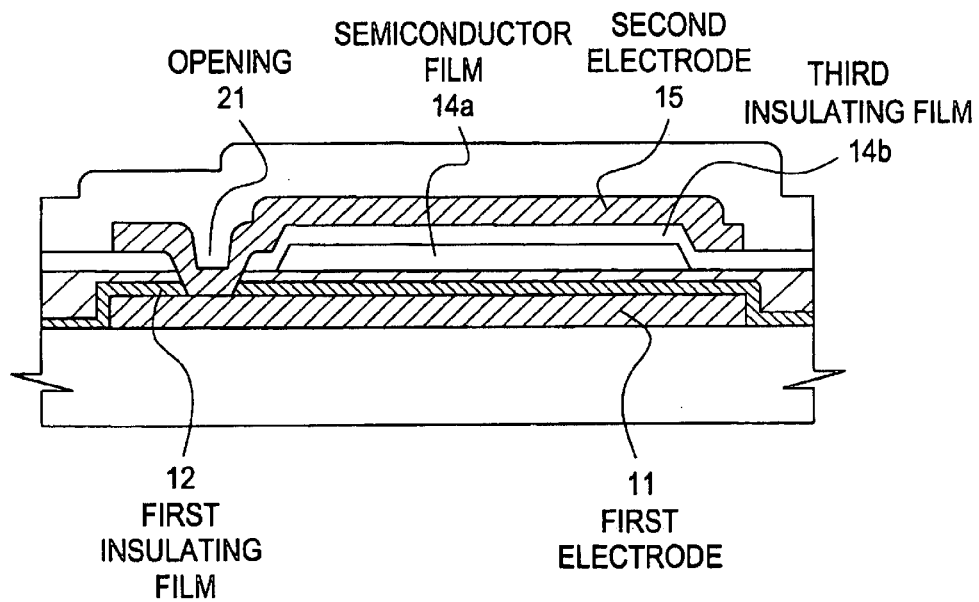

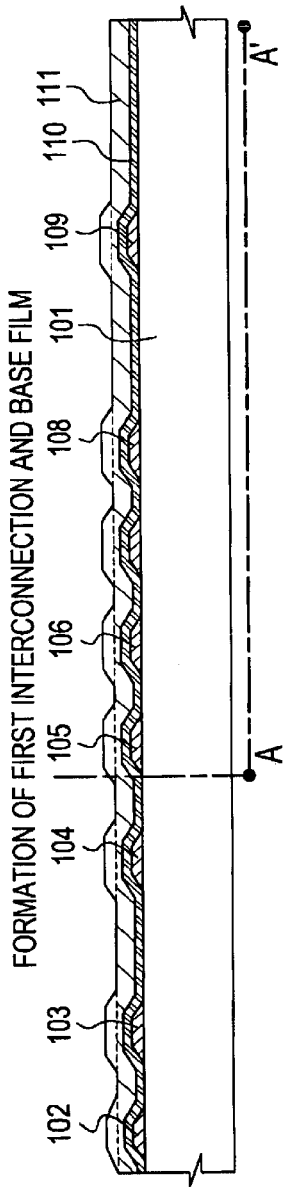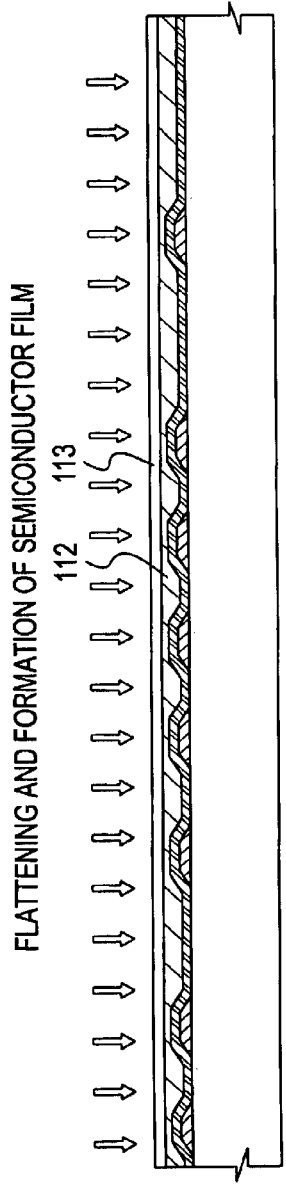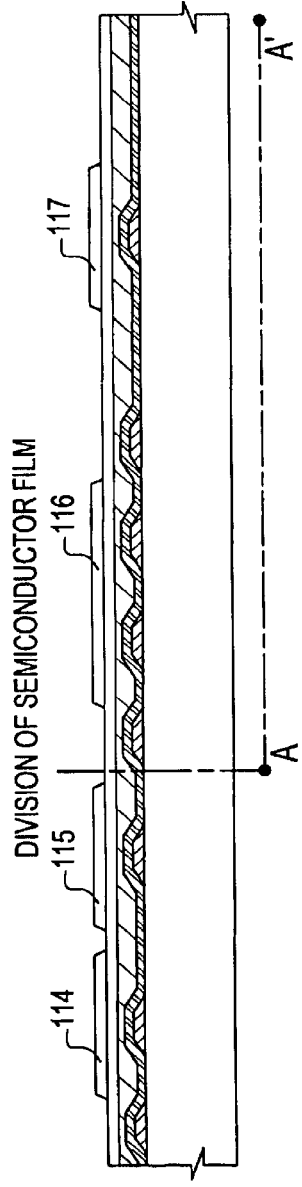

FORMATION OF GATE INSULATING FILM AND CONDUCTIVE FILM AND SECOND INTERCONNECTION PATTERN

FIRST ETCHING TREATMENT/FIRST DOPING TREATMENT

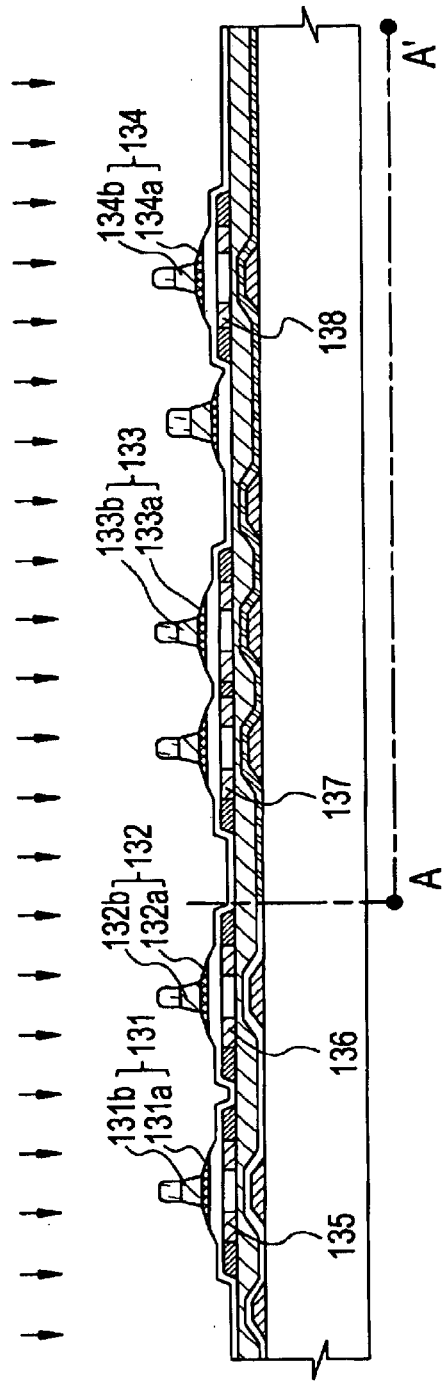
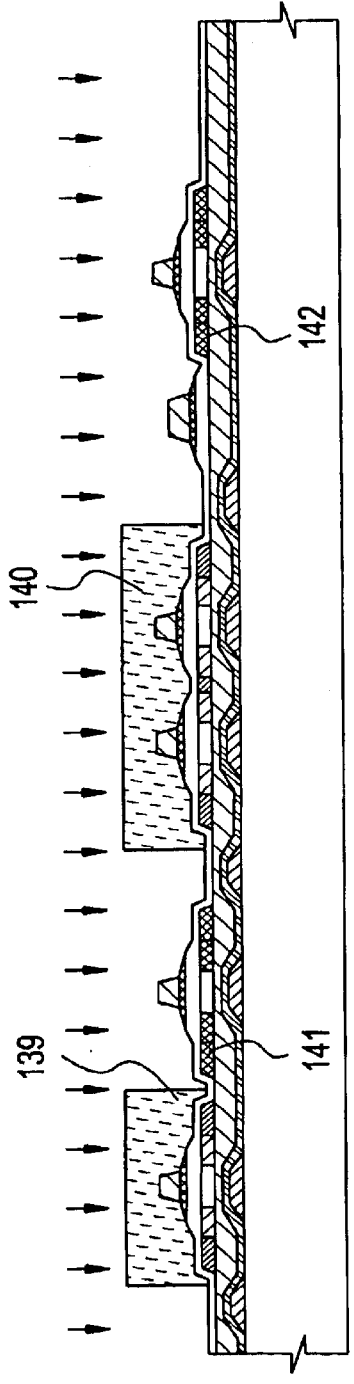
FIG. 4A
SECOND ETCHING TREATMENT AND SECOND DOPING TREATMENT
FIG. 4B
THIRD DOPING TREATMENT

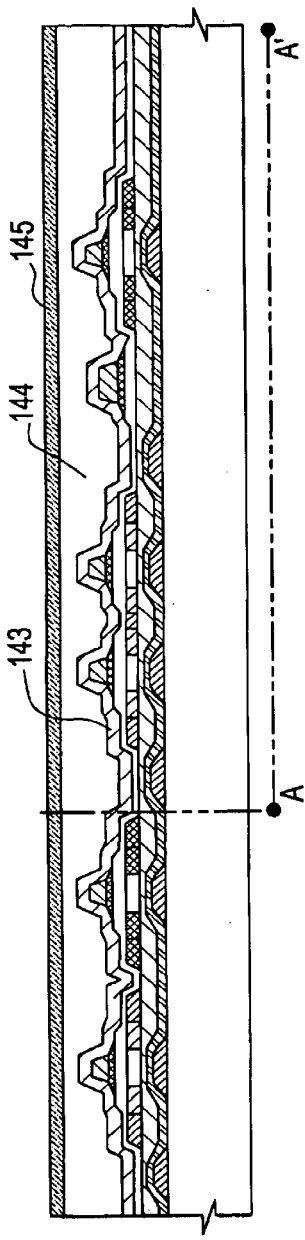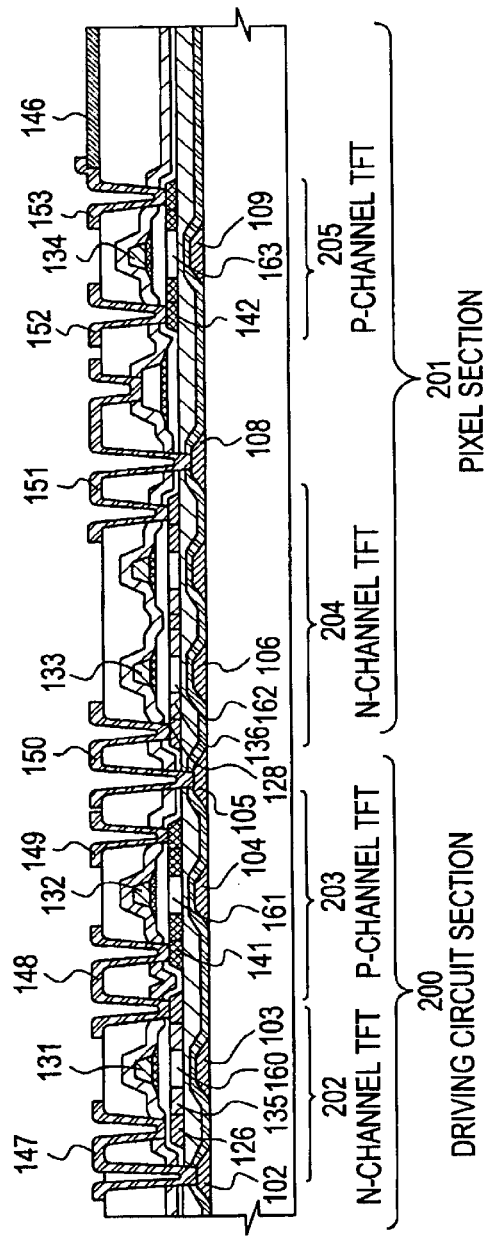
FIG. 5A
FORMATION OF INTERLAYER INSULATING FILM/(FLATTENING TREATMENT)/
FORMATION OF TRANSPARENT CONDUCTIVE FILM
FIG. 5B
FORMATION OF CONTACT HOLE AND FORMATION OF THIRD INTERCONNECTION

FORMATION OF FIRST INTERCONNECTION

DIVISION OF SEMICONDUCTOR FILM

FORMATION OF SECOND INTERCONNECTION

FORMATION OF TRANSPARENT CONDUCTIVE FILM

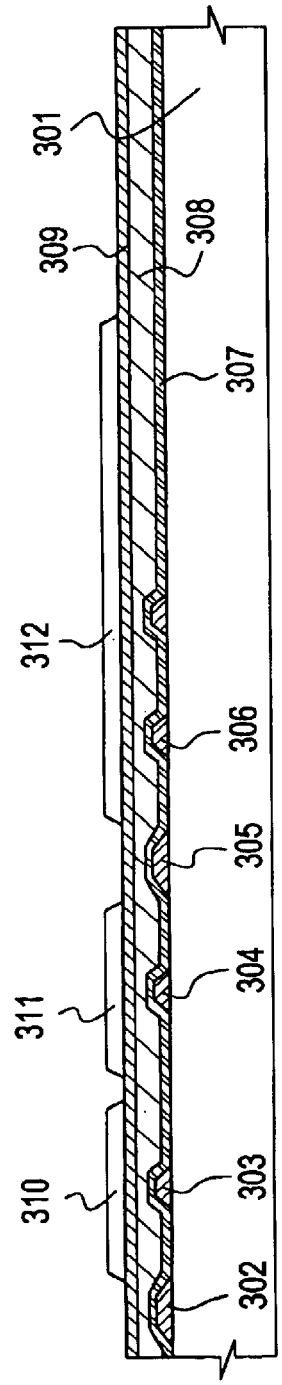
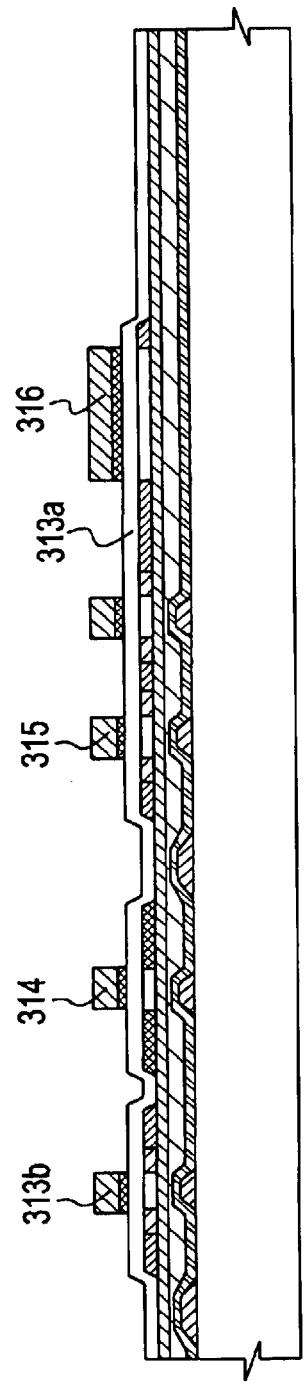

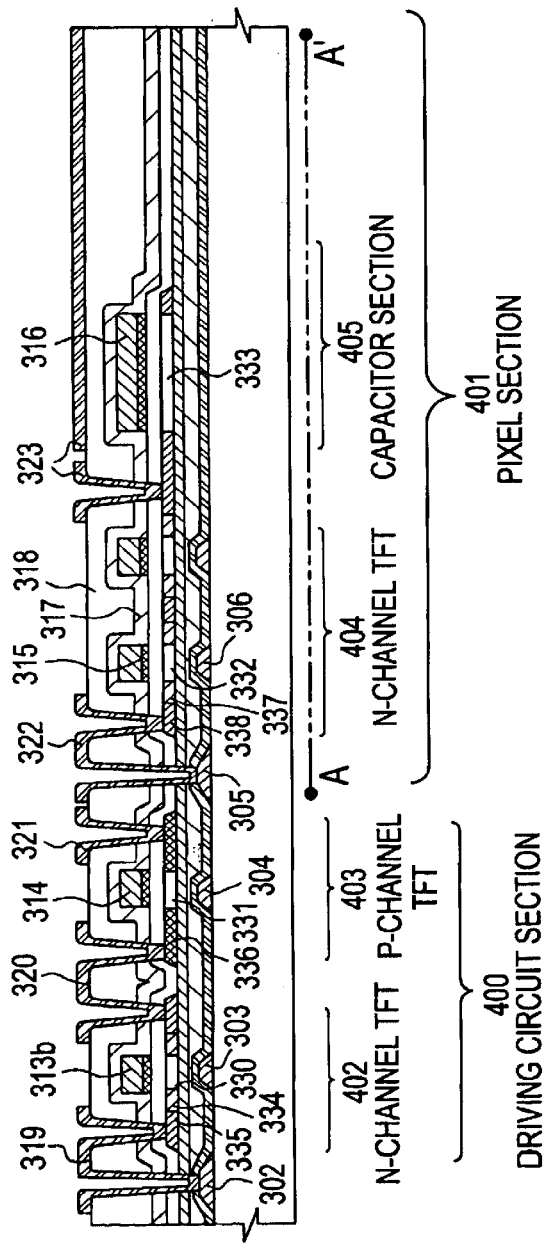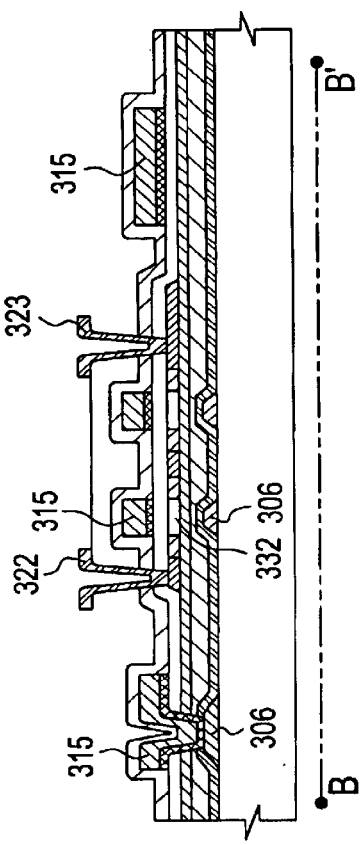

609: EL DRIVER POWER SOURCE LINE
610 : EL ELEMENT

SEMICONDUCTOR DEVICE AND METHOD FOR MANUFACTURING THE SAME

This application is a Continuation-In-Part of U.S. application Ser. No. 10/105,625 filed Mar. 26, 2002.

BACKGROUND OF THE INVENTION

1. Field of the Invention

The present invention relates to a semiconductor device using a thin film transistor (hereinafter referred to as a TFT) wherein a semiconductor film formed on a substrate and having a crystal structure is used; and a process for manufacturing the same. The semiconductor device in the present specification means any device which functions by the use of a semiconductor characteristic, and the category of the semiconductor device manufactured by the present invention includes a display device, a typical example of which is a liquid crystal display device having therein TFTs, and a semiconductor integrated circuit (such as a microprocessor, a signal processing circuit, or a high frequency circuit).

2. Description of Related Art

In various semiconductor devices having therein semiconductor elements, such as a television, a personal computer or a portable telephone, a display for displaying characters or images is an essential means from which people recognize information. Particularly in recent years, a planar display (flat panel display), a typical example of which is a liquid crystal display device using the electrooptic property of liquid crystal, has been actively used.

As one form of the flat panel display, there is known an active matrix driving system wherein a TFT is fitted to each pixel and a picture is displayed by writing data signals successively. TFTs are essential elements for realizing the active matrix driving system.

In almost all cases, TFTs are manufactured using amorphous silicon. However, TFTs have a low electric field effect mobility and cannot be operated by frequencies necessary for processing picture signals. Therefore, TFTs are used only as switching elements fitted to respective pixels. A data line driving circuit for outputting picture signals to data lines or a scanning line driving circuit for outputting scanning signals to scanning lines is processed by an outside IC (IC driver) mounted by TAB (tape automated bonding) or COG (chip on glass).

However, as the density of pixels becomes larger, the pitch of the pixels becomes narrower; therefore, it is considered that the system in which a driver IC is mounted has a limit. For example, in the case that UXGA (pixel number: 1200×1600) is supposed, 6000 connecting terminals are required in an RGB coloring system at the simplest estimate. An increase in the number of the connecting terminals causes an increase in the probability that contact faults are generated. Moreover, the peripheral area (frame area) of its pixel section increases. As a result, it is unsuccessful that a semiconductor device using this as a display is made small-sized, and the design of the appearance thereof is damaged. In light of such background, a display device integrated with a driving circuit is clearly demanded. By integrating a pixel section with scanning line and data line driving circuits on a single substrate, the number of connecting terminals decreases drastically and the area of the frame area can also be made small.

As a means for realizing the above, suggested is a method of making TFTs of a polycrystal silicon film. However, even if polycrystal silicon is used to form TFTs, after all the electric properties thereof are not equivalent to the properties of MOS transistors formed in a monocrystal silicon substrate. For example, the electric field effect mobility thereof is not more than $\frac{1}{10}$ of that of monocrystal silicon. This method has a problem that off-state current is large because of defects formed in boundaries between crystal grains.

However, for a data line driving circuit, high driving ability (on-state current, $I_{on}$) is required and an improvement in the reliability thereof is also required by preventing deterioration based on hot carrier effect. In addition, for a pixel section, low off-state current ($I_{off}$) is required.

As a TFT construction for reducing the off-state current, a lightly doped drain (LDD) construction is known. This construction is a construction wherein an LDD region. to which an impurity element is added at a low concentration, is arranged between a channel formed region and a source region or a drain region formed by the addition of an impurity element at a high concentration. As a construction effective for preventing deterioration of the on-state current based on hot carries, there is known an LDD construction wherein a gate element is overlapped with some portions of an LDD area (hereinafter, the gate-drain overlapped LDD is abbreviated to the GOLD).

In pixels in an active matrix driving system provided with TFTS, pixel electrodes for applying voltage to liquid crystal are set up, and scanning lines (gate lines) connected to gate electrodes cross data lines connected to sources or drains. As an auxiliary capacitor, the following two types are known: an addition capacitor type, wherein a pixel electrode is overlapped with a scanning line (gate line) in the preceding stage; and an accumulation capacitor type, wherein an exclusive capacitor line is set up. In either case, as image quality is made finer and minuter, the size of the TFT or the auxiliary capacitor allowable for each pixel is inevitably made smaller. Therefore, in order to make the numerical aperture of each pixel high within a restricted scope of pixel size, it is indispensable to lay out elements necessary for the construction of these pixels effectively.

TFTs are manufactured by laminating semiconductor films, insulating films, or conductive films while etching them into given shapes, using photo masks. However, if the number of the photo masks is simply increased in order to make the construction of the TFTs optimal in accordance with requests for a pixel section or respective driving circuits, the manufacturing steps become complicated and the number of the steps increases unavoidably.

In order to realize a high numerical aperture within a restricted scope of pixel size, it is indispensable to lay out elements necessary for the construction of a pixel section effectively.

SUMMARY OF THE INVENTION

An object of the present invention is to make the arrangement of pixel electrodes, scanning lines (gate lines) and data lines formed in a pixel section appropriate, and provide a pixel construction wherein a high numerical aperture is realized without increasing the number of masks nor the number of steps.

Furthermore, an object thereof is to provide a technique for improving properties of a TFT, and realizing the construction of the TFT optimal for conditions for driving a pixel section or a driving circuit, using a fewer photo masks.

In order to solve the above-mentioned problems, the present invention has a construction comprising a first electrode, a first insulating film and a second insulating film formed between a semiconductor film and the first electrode, and a third insulating film formed between the semiconductor film and a second electrode, wherein the semiconductor film is formed on a flat surface of the second insulating film, a cross portion where the first electrode and the second electrode cross the semiconductor film at the same position is formed, and the first electrode and the second electrode are connected to each other through an opening made in the first insulating film and the second insulating film outside the cross portion.

Besides the above construction, the present invention has a construction comprising a first electrode and a first interconnection; a semiconductor film; a first insulating film and a second insulating film formed between the semiconductor film and the first electrode; a third insulating film formed between the semiconductor film and the second electrode and between the semiconductor film and the second interconnection; and a fourth insulating film formed on the second electrode and the second interconnection, wherein the semiconductor film is formed on a flat surface of the second insulating film, a cross portion where the first electrode and the second electrode cross the semiconductor film at the same position is formed, and the first electrode and the second electrode are connected to each other through an opening made in the first insulating film and the second insulating film outside the cross portion, and the first interconnection and the semiconductor films are connected to each other, through a first opening made in the first to fourth insulating films and through a second opening made in the third insulating film and the fourth insulating film, by means of a third electrode.

Besides the above constructions, the present invention has a construction comprising a first electrode and a first interconnection; a first insulating film and a second insulating film formed between a semiconductor film and the first electrode; a third insulating film formed between the semiconductor film and a second electrode and between the semiconductor film and a second interconnection; and a fourth insulating film formed on the second electrode and the second interconnection, wherein the semiconductor film is formed on a flat surface of the second insulating film, a cross portion where the first electrode and the second electrode cross the semiconductor film at the same position is formed, and the first electrode and the second electrode are connected to each other through an opening made in the first insulating film and the second insulating film outside the cross portion, the first interconnection and a first impurity region of one-conduction-type formed in the semiconductor film, are connected to each other, through a first opening made in the first to fourth insulating films and through a second opening made in the third insulating film and the fourth insulating film, by a third electrode, and a fourth electrode is connected, through a third opening in the third insulating film and the fourth insulating film, to a second impurity region of the one-conduction-type formed in the semiconductor film.

By putting the semiconductor film between the first electrode and the second electrode and applying the same voltage thereto, substantially the same effect as obtained by making the film thickness of the semiconductor film substantially half can be obtained. Moreover, a depletion layer is rapidly spread so that the sub-threshold coefficient can be made small. The electric field effect mobility can be improved. Particularly by making edges of the first electrode and the second electrode consistent with each other in the cross portion of the electrodes and the semiconductor film, the advantageous effect can be more satisfactorily exhibited.

By making the first interconnection and the second interconnection up to a data line and a scanning line, respectively, a pixel section corresponding to an active matrix driving system can be formed. By combining the first and fourth insulating films, pixel electrodes can be formed as a topmost layer. By forming the interconnections to overlap with each other, the area thereof can be made large. By such a construction, the numerical aperture of pixels can be improved.

The manufacturing process of the present invention for realizing such a construction comprises the steps of forming a first electrode and a first interconnection on an insulating surface, forming a first insulating film and a second insulating film on the first electrode and the first interconnection, making the second insulating film flat by chemical-mechanical polishing, forming a semiconductor film on the second insulating film, forming a third insulating film on the semiconductor film, making an opening in the first to third insulating films, exposing a part of the first electrode by the opening, forming a second electrode and a second interconnection on the third insulating film, and connecting the first electrode and the second electrode to each other in the opening.

Another process comprises the steps of forming a first electrode and a first interconnection on an insulating surface, forming a first insulating film and a second insulating film on the first electrode and the first interconnection, making the second insulating film flat by chemical-mechanical polishing, forming a semiconductor film on the second insulating film, forming a third insulating film on the semiconductor film, making an opening in the first to third insulating films, exposing a part of the first electrode by the opening, forming a second electrode and a second interconnection on the third insulating film, connecting the first electrode and the second electrode to each other in the first opening, forming a fourth insulating film on the second electrode and the second interconnection, making a second opening in the first to fourth insulating films, exposing a part of the first interconnection by the opening, making a third opening in the third and fourth insulating films, exposing a part of the semiconductor film by the opening, forming a third electrode on the fourth insulating film, and connecting the first interconnection and the semiconductor film to each other in the second opening and the third opening.

A further process comprises the steps of forming a first electrode and a first interconnection on an insulating surface, forming a first insulating film and a second insulating film on the first electrode and the first interconnection, making the second insulating film flat by chemical-mechanical polishing, forming a semiconductor film on the second insulating film, forming a third insulating film on the semiconductor film, making an opening in the first to third insulating films, exposing a part of the first electrode by the opening, forming a second electrode and a second interconnection on the third insulating film, connecting the first electrode and the second electrode to each other in the first opening, forming a pair of one-conduction-type impurity regions in the semiconductor film, forming a fourth insulating film on the second electrode and the second interconnection, making a second opening in the first to fourth insulating films, exposing a part of the first interconnection by the opening, making a third opening in the third and fourth insulating films, exposing a part of one of the one-conduction-type impurity regions formed in the semiconductor film by the opening, forming a third electrode on the fourth insulating film, and connecting the first interconnection and the one of the one-conduction-type regions formed in the semiconductor film to each other in the second opening and the third opening.

According to the manufacturing processes, a semiconductor device composed of a driving circuit section and a pixel section can be manufactured from n-channel type TFTs and p-channel type TFTs, using seven photo masks. Using chemical-mechanical polishing, irregularities on the lower side of the semiconductor film, resulting from the first electrode and the first interconnection, can be removed.

BRIEF DESCRIPTION OF THE DRAWINGS

FIGS. 1A and 1B are sectional views of the construction of a TFT of the present invention.

FIGS. 2A to 2C are sectional views for explaining the steps of manufacturing a driving circuit section and a pixel section in a luminous device.

FIGS. 4A and 4B are sectional views for explaining the steps of manufacturing the driving circuit section and the pixel section in the luminous device.

FIGS. 5A and 5B are sectional views for explaining the steps of manufacturing the driving circuit section and the pixel section in the luminous device.

FIGS. 10A and 10B are sectional views for explaining the steps of manufacturing a driving circuit section and a pixel section in a liquid crystal display device.

FIGS. 11A and 11B are sectional views for explaining the steps of manufacturing the driving circuit section and the pixel section in the liquid crystal display device.

PREFERRED EMBODIMENTS OF THE INVENTION

Figure 3A:
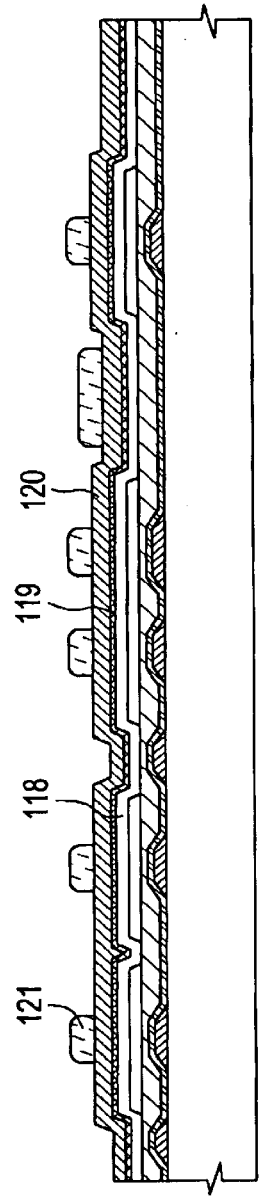
FIGS. 3A and 3B are sectional views for explaining the steps of manufacturing the driving circuit section and the pixel section in the luminous device.

Referring to FIG. 1, an embodiment of the present invention will be described. In FIG. 1A, a first electrode 11 is formed on a substrate 10 having an insulating surface. The first electrode 11 is made of one or more alloys or compounds selected from tungsten (W), molybdenum (Mo), tantalum (Ta) and titanium (Ti). The thickness thereof is from 150 to 400 nm.

As a first insulating film 12 covering the first electrode 11, a silicon oxynitride film or a silicon nitride film is formed to have a thickness of 10 to 50 nm. In the case of using the silicon oxynitride film, there is used a film produced from a mixed gas of $SiH_4$, $NH_3$ and $N_2O$ by plasma CVD and containing therein 20 to 40 atomic % of nitrogen. In either case of this silicon oxynitride film or silicon nitride film, it is possible to prevent the diffusion of impurities such as alkali metals from the substrate 10 because of the use of the insulating film containing nitrogen.

A second insulating film 13 is formed on the first insulating film 12. The second insulating layer 12 is formed to have a thickness of 0.5 to 10 $\mu$m, using a silicon oxynitride film or a silicon oxide film. The surface of the first insulating layer 12 has irregularities resulting from the previously-formed first electrode 11. The irregularities are made flat by polishing the surface. As a manner of making the surface flat, chemical-mechanical polishing (hereinafter referred to as CMP) is preferably used. As a polishing material (slurry) for the CMP of the second insulating film, there is preferably used, for example, a slurry wherein fumed silica particles obtained by decomposing silicon chloride gas thermally are dispersed in a KOH-added aqueous solution. By the CMP, the second insulating film 13 is removed by about 0.1 to 0.5 $\mu$m, so as to make the surface flat.

A semiconductor film 14 having a crystal structure is formed on the second insulating film 13 whose surface is made flat. This is obtained by crystallizing an amorphous semiconductor film formed on the first insulating film 12. After the deposition of the amorphous semiconductor film, the film is crystallized by heating treatment or the application of a laser. The material of the amorphous semiconductor film is not limited, preferably, the material may be a silicon semiconductor film, a semiconductor film wherein germanium is added, as a lattice strain relieving agent, to silicon ($Si_{1-x}Ge_x$; 0<x<1, typically X=0.001 to 0.05), or the like.

A third insulating film 15 is formed on the semiconductor film 14a, and further a second electrode 16 is formed to cross the semiconductor film 14a. The first electrode 11 and the second electrode 15 are arranged in such a manner that their edges are substantially consistent with each other. The crossing portion of the semiconductor films, sandwiched between the two, becomes a channel formed region 18. Outside the channel formed region 18, a first impurity region 19 making a source or a drain and a second impurity region 20 making an LDD are formed. The LDD 20 is not essential, but may be formed if necessary. Additionally, a fourth insulating film 16 and an interconnection 17 are set if necessary.

As illustrated in FIG. 1B, the first electrode 11 and the second electrode 15 are electrically connected to each other outside the semiconductor film 14 and in an opening 21 made in the first insulating film 12, the second insulating film 13 and the third insulating film 14b.

The thickness of the film removed by the CMP is decided, considering the thickness of the first insulating film 12 and the second insulating film 13, the dielectric constant thereof, and the thickness of the third insulating film 14b. The remaining film functions substantially as a gate insulating film. Accordingly, the polishing may be performed in such a manner that both of the first insulating film 12 and the second insulating film 13 remain on the first electrode 11, or the first insulating film 12 may be exposed.

For example, the first insulating film 12 and the second insulating film 13 are made of silicon oxynitride films, and the dielectric constant thereof is 7.5. In the case that the third insulating film 14b is made of a silicon oxide film, the dielectric constant thereof is 3.9. In the two, a difference is generated. In this case, it is advisable about the finished size after the CMP to set the total film thickness of the first insulating film 12 and the second insulating film 13 to 150 nm and set the film thickness of the third insulating film 15 to 110 nm.

As a TFT, the following types are known depending on the arrangement of a semiconductor film, a gate insulating film and a gate electrode: a top gate type (planar type), a bottom gate type (reverse stagger type), and so on. In all cases, in order to make the sub-threshold coefficient thereof small, it is necessary to make the film thickness small. In the case that a semiconductor film obtained by crystallizing an amorphous semiconductor film is used as in a TFT, the crystallinity of the amorphous semiconductor film becomes worse as the thickness thereof becomes smaller. As a result, the effect resulting from the matter that the film thickness is made small cannot be purely obtained. However, by placing electrodes on and beneath a semiconductor film as illustrated in FIG. 1, the same effect as obtained by making the thickness of the semiconductor film substantially half can be obtained. As a result, depletion is more rapidly attained with the application of voltage. Thus, the electric field effect mobility and the sub-threshold coefficient can be made small.

The first electrode 11 has been described herein, but using this layer at the same time, interconnections for transmitting various signals or electric power can be formed. If it is combined with flattening treatment by CMP, no effect is produced on a semiconductor film etc. formed thereon. The density of interconnections can be made high by multi-layered interconnections. The following will describe specific examples which are applied to an active matrix driving display device by way of Examples.

EXAMPLES

Example 1

Referring to the drawings, an embodiment of the present invention will be described. Herein, there will be detailed a process of forming a pixel section and TFTs (n-channel type TFTs and p-channel type TFTs) of a driving circuit set up near the pixel section, simultaneously, on the same substrate. FIGS. 2 to 6, which are referred to in the present embodiment, are sectional views for explaining the steps of manufacturing them. FIGS. 7 to 9 are top views corresponding thereto. For convenience of the description, common reference numbers are used.

In FIG. 2A, for a substrate 101, a glass substrate, a quartz substrate, a ceramic substrate or the like can be used. It is allowable to use an insulating film formed on the surface of a silicon substrate, a metal substrate or a stainless substrate. It is also allowable to use a heat-resistant plastic substrate giving resistance against treating temperature in the present example.

First interconnections 102, 105 and 108 and first electrodes 103, 104, 106 and 109 are formed on an insulating surface of this substrate 101. The first interconnections and the first electrodes are made of a conductive material consisting of one or more selected from W, Mo, Ti and Ta. FIG. 7A shows a top view of them in a pixel section. Herein, the interconnections 105 and 107 are used as a data line and an electric power supplying line, respectively. The first electrodes 106 and 108 are used as gate electrodes of one type of the TFTs.

After the first interconnections and the first electrodes are formed, a first insulating film 110 and a second insulating film 111 are formed. The first insulating film 110 is formed to have a thickness of 10 to 50 nm, using a silicon oxynitride film. The second insulating film 111 is formed to have a thickness of 0.5 to 1 $\mu$m, using a silicon oxide film or a silicon oxynitride film.

The surface of the second insulating film has irregularities resulting from the previously-formed first interconnections and first electrodes. Preferably, the irregularities are made flat. As the manner of the flattening, CMP is used. As a polishing material (slurry) for the CMP of the second insulating film, there is preferably used, for example, a slurry wherein fumed silica particles obtained by decomposing silicon chloride gas thermally are dispersed in a KOH-added aqueous solution. By the CMP, the second insulating film is removed by about 0.1 to 0.5 $\mu$m, so as to make the surface flat.

In this way, a second insulating film 112 made flat is formed, as illustrated in FIG. 2B. A semiconductor film is formed thereon. The semiconductor film 113 is made of a semiconductor having a crystal structure. This is obtained by crystallizing an amorphous semiconductor film formed on the first insulating film 12. After the deposition of the amorphous semiconductor film, the film is crystallized by heating treatment or the application of a laser. The material of the amorphous semiconductor film is not limited. Preferably, the material may be silicon, silicon germanium alloy ($Si_{1-x}Ge_x$; 0<x<1, typically X=0.001 to 0.05), or the like.

Thereafter, the semiconductor film 113 is divided into an island form by etching, to form semiconductor films 114 to 117, as illustrated in FIG. 2C. FIG. 7B shows a top view thereof, wherein the first electrodes and the semiconductor films are arranged to cross.

Next, as illustrated in FIG. 3A, a third insulating film 118 is formed to cover the semiconductor films 104 to 107. The third insulating film 118 is made of an insulator containing silicon by plasma CVD or sputtering. The thickness thereof is set to 40 to 150 $\mu$m. The third insulating film formed to cover the semiconductor films 114 to 117 is used as a gate insulating film of the TFTs manufactured in the present embodiment.

A conductive film is formed on the third insulating film 118 to form gate electrodes and interconnections. In the present invention, the gate electrodes are formed by laminating two or more conductive films. A first conductive film 119 formed on the second insulating film 118 is made of a nitride of a high melting point metal such as molybdenum or tungsten. A second conductive film 120 formed thereon is made of a high melting point metal, a low-resistance metal such as aluminum or copper, polysilicon, or the like. Specifically, for the first conductive film, a nitride of one or more selected from W, Mo, Ta and Ti is selected, and for the second conductive film, an alloy of one or more selected from W, Mo, Ta, Ti, Al and Cu, or n-type polycrystal silicon is selected. After a mask 121 is formed, the first conductive film and the second conductive film 120 are etched to form second interconnections and second electrodes.

Figure 3B:
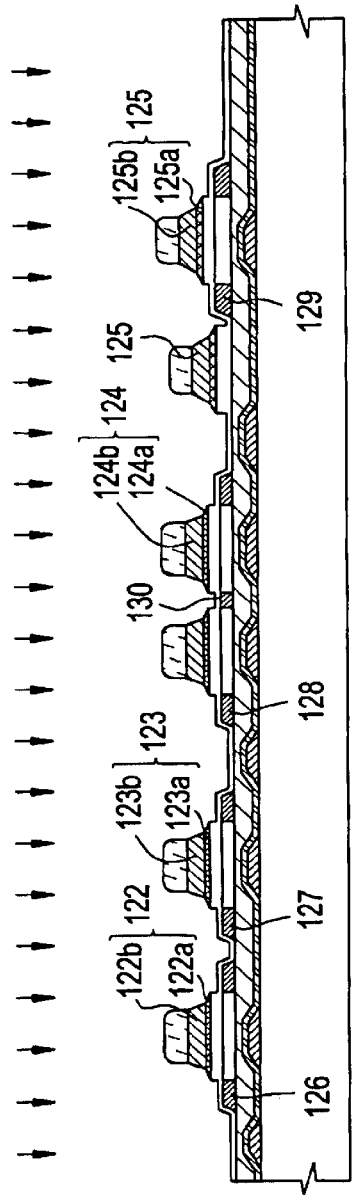

As illustrated in FIG. 3B, by a first etching treatment, first-shape electrodes 122 to 125 (made of first conductive films 122a to 125a, and second conductive films 122b to 125b), edges of which are tapered, are formed. The surface of a third insulating film 130 not covered with the first-shape electrodes 122 to 125 and a first-shape interconnection 125 is etched by about 20 to 50 nm, so that regions having a small thickness are formed.

A first doping treatment is conducted by ion implantation, or ion doping wherein ions are implanted without performing mass separation. In the doping, the first-shape electrodes 122 to 125 are used as a mask to form one-conduction-type impurity regions 126 to 129 having a first concentration in the semiconductor films 114 to 117. The first concentration is set to $1 \times 10^{20}$ to $1.5 \times 10^{21}/cm^3$.

Next, as illustrated in FIG. 4A, a second etching treatment is conducted without removing the mask composed of the resist. In this etching treatment, the second conductive film is subjected to anisotropic etching to form second-shape electrodes 131 to 134 (made of first conductive films 131a to 134a and second conductive films 131b to 134b). By this etching treatment, the width of the second-shape electrodes 131 to 134 is made small, and these electrodes are formed in such a manner that the edges thereof are positioned inside the one-conduction-type impurity regions 126 to 129 having the first concentration. As described in the next step, the length of LDDs is decided by this shrunk width.

Figure 8A:
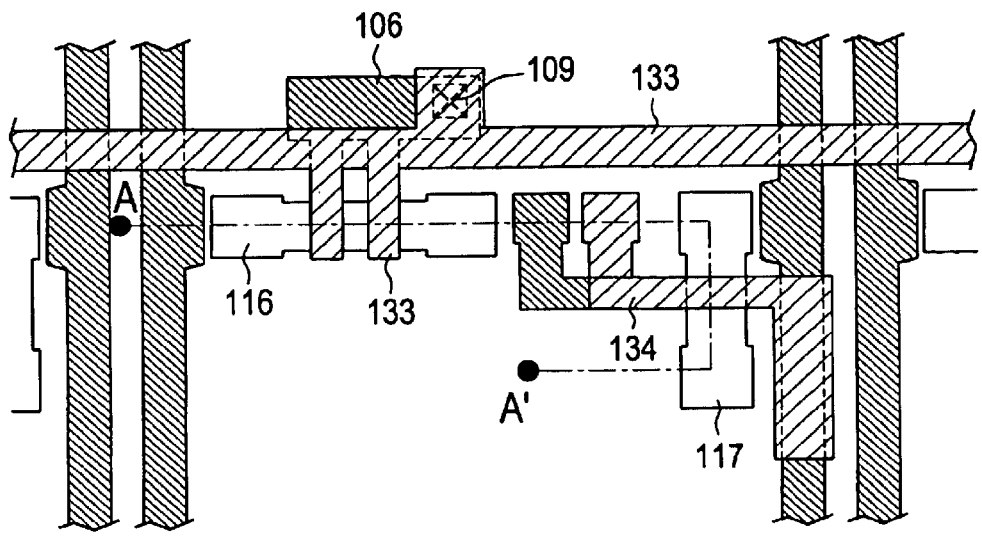
FIGS. 8A and 8B are top views for explaining the step of manufacturing the pixel section of the luminous device.
Figure 8B:
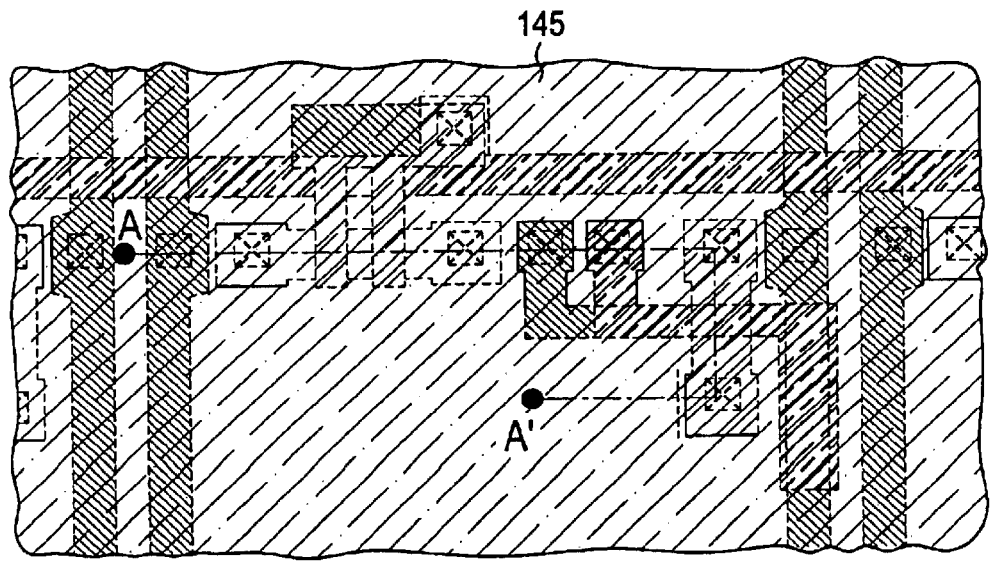
Figure 9:
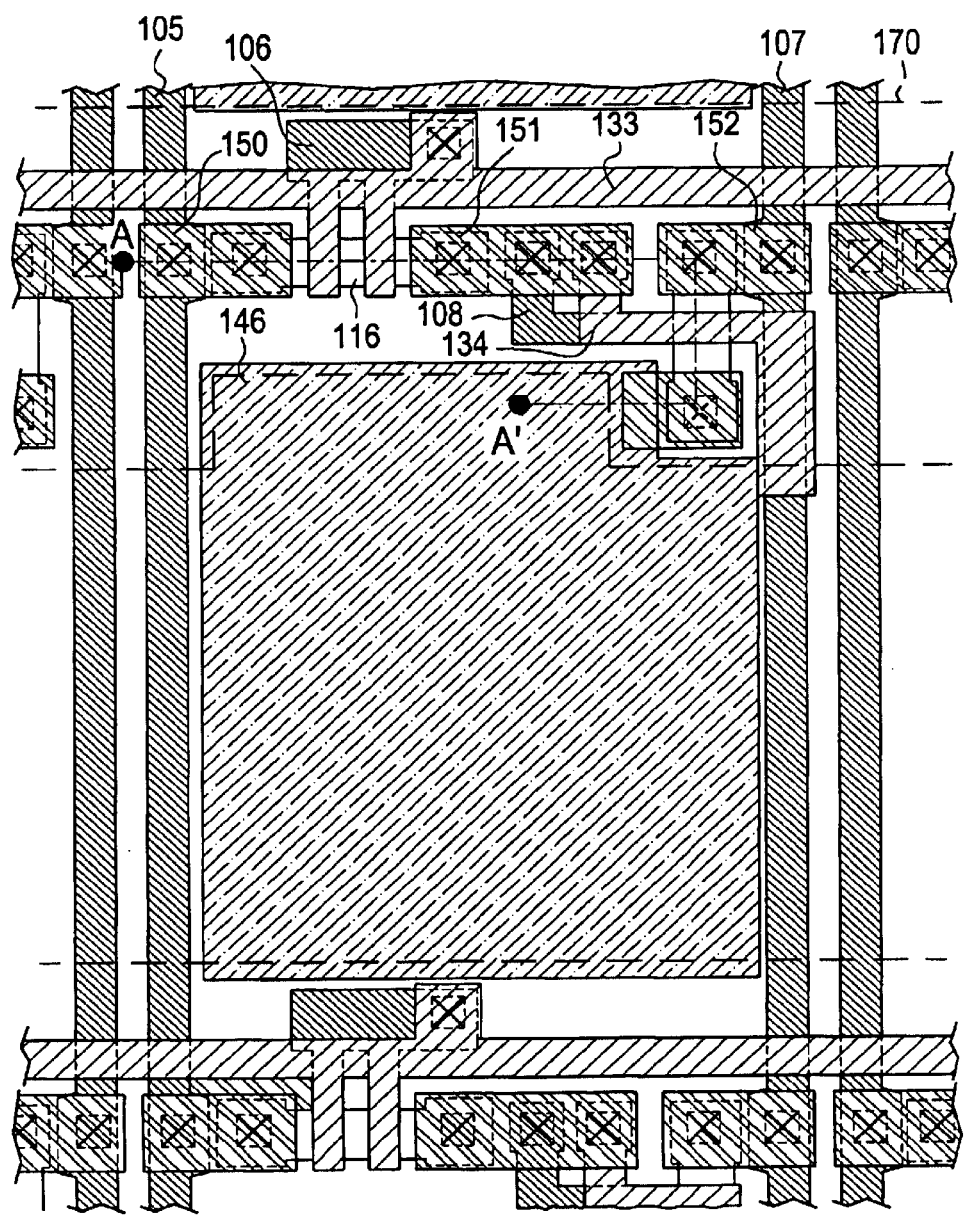
FIG. 9 is a top view for explaining the construction of the pixel section of the luminous device.

FIG. 8A is a top view thereof, and illustrates a state that the second-shape electrodes 133 and 134 are arranged to overlap with the semiconductor films 116 and 117, respectively, and form cross portions. The cross portions are arranged at the same positions as cross portions where the first electrodes cross the semiconductor films. The first electrode 116 and the second electrode 133 are electrically connected through an opening 109 made in the third insulating film, the first insulating film and the second insulating film.

In this state, a second doping treatment is conducted to add a one-conduction-type impurity to the semiconductor films 114 to 117. One-conduction-type impurity regions 135 to 138 having a second concentration, which result from this doping treatment, are formed in self-alignment to overlap partially with the first conductive films 131a to 134a constituting the second-shape electrodes 131 to 134. The impurity added by ion doping is passed through the first conductive films 131a to 134a, and added. Therefore, the number of ions reaching the semiconductor films is reduced so that the concentration thereof inevitably becomes low. The concentration thereof is from $1 \times 10^{17}$ to $1 \times 10^{19}/cm^3$.

Next, as illustrated in FIG. 4B, masks 139 and 140 made of a resist are formed, and then a third doping treatment is conducted. By this third doping treatment, impurity regions 141 and 142 of a conduction-type reverse to the one-conduction-type, which have a third concentration, are formed in the semiconductor films 115 and 117. This reverse-conduction-type impurity regions having the third concentration are formed in regions overlapping with the second-shape electrodes 132 and 134. The impurity element is added at a concentration within the range of $1.5 \times 10^{20}$ to $5 \times 10^{21}/cm^3$.

By the above-mentioned steps, the regions to which the impurity is added to control valence electrons are formed in the respective semiconductor films. The first electrodes 103, 104, 106 and 109 and the second-shape electrodes 131 to 134 function as gate electrodes at positions where they cross the semiconductor films. They also become gate electrodes. The second-shape interconnection 134 constitutes a capacitor at a site where it overlaps with the first interconnection 107.

Thereafter, the step of activating the impurity elements added to the respective semiconductor films is performed. This activation is performed by instantaneous annealing in a gas-heating manner. The temperature for the heating treatment is from 400 to 700° C., typically from 450 to 500° C. in the atmosphere of nitrogen. Besides, laser annealing using a second harmonic wave (532 nm) of a YAG laser may be used. In order to perform the activation by the application of a laser ray, a second harmonic wave (532 nm) of a YAG laser is used to be applied to the semiconductor films. Of course, the same manner is performed in the RTA method using a lamp light source, as well as the laser ray. The semiconductor films are heated by radiant heat of the lamp light source from both surfaces of the substrate or a substrate shell.

Thereafter, as illustrated in FIG. 5A, a third insulating film 143 made of silicon nitride is formed by plasma CVD to have a thickness of 50 to 100 nm. A clean oven is used to perform a heat treatment at 410° C. In this way, the semiconductor films are hydrogenated with hydrogen released from the silicon nitride film.

Next, a fourth insulating film 144 made of an organic insulating material is formed on the passivation film (the third film) 143. The reason why the organic insulating material is used is that the surface of the insulating film 144 is made flat. In order to obtain a more satisfactory flat face, this surface is desirably subjected to flattening treatment by CMP. In the case of using CMP together, the fourth insulating film which can be used may be a silicon oxide film formed by plasma CVD, an SOG (spin on glass) or PSG formed by coating, or the like.

A transparent conductive film 145 made mainly of indium tin oxide is formed on the thus-flattened fourth insulating film 144, to have a thickness of 60 to 120 nm. Since fine irregularities are formed in this surface, the surface is desirably polished and flattened by CMP using aluminum oxide as an abrasive agent. FIG. 8A illustrates a top view of this state.

Thereafter, the transparent conductive film 145 is etched to form a third electrode 146. Openings are made in the 1st to 4th insulating films, or the third insulating film and the fourth insulating film (including the passivation film 143), and then interconnections 147 to 153 are formed. The interconnections are formed by laminating a titanium film and an aluminum film.

If the one-conduction-type impurity regions are made into an n-type and the reverse conduction-type impurity regions are made into a p-type in the above-mentioned steps, a driving circuit section 200 having an n-channel type TFT 202 and a p-channel type TFT 203, and a pixel section 201 having an n-channel type TFT 204 and a p-channel type TFT 205 are formed on the same substrate.

In the n-channel type TFT 202 of the driving circuit section 200, a pair of gate electrodes 131 and 103 constitutes a channel formed region 160. The one-conduction-type impurity region 135 having the second concentration functions as an LDD, and the one-conduction-type impurity region 126 having the first concentration functions as a source or drain region. In the p-channel type TFT 203, a pair of gate electrodes 132 and 104 constitutes a channel formed region 161. The reverse conduction-type impurity region 141 functions as a source or drain region. The length, in the channel length direction, of the LDD is from 0.5 to 2.5 μm, preferably 1.5 μm. A main purpose of such a construction of the LDD is to prevent deterioration of the TFTs based on hot carrier effect. The n-channel type TFT and the p-channel type TFT can constitute a shift register circuit, a buffer circuit, a level shifter circuit, a latch circuit or the like. The construction of the n-channel type TFT 202 is particularly suitable for a buffer circuit having a high driving voltage, in order to prevent the deterioration based on hot carrier effect.

In the n-channel type TFT 204 of the pixel section 201, a pair of gate electrodes 133 and 106 constitutes a channel formed region 162. The one-conduction-type impurity region 136 having the second concentration functions as an LDD, and the one-conduction-type impurity region 128 having the first concentration functions as a source or drain region. This n-channel type TFT 204 is in a form wherein two TFTs are connected to each other in series so as to sandwich the one-conduction-type impurity region having the first concentration.

As described above, in the present invention, a pair of gate electrodes is formed to sandwich a semiconductor film, whereby the thickness of the semiconductor is made substantially half and further depletion advances rapidly with the application of gate voltage to increase electric field effect mobility. The sub-threshold coefficient can be made low. As a result, by using a TFT having this structure in a driving circuit, the driving voltage thereof can be made low. Moreover, the current driving ability is improved and the size (particularly the channel width) of the TFT can be made small. For this reason, the integration degree can be improved.

Figure 6:
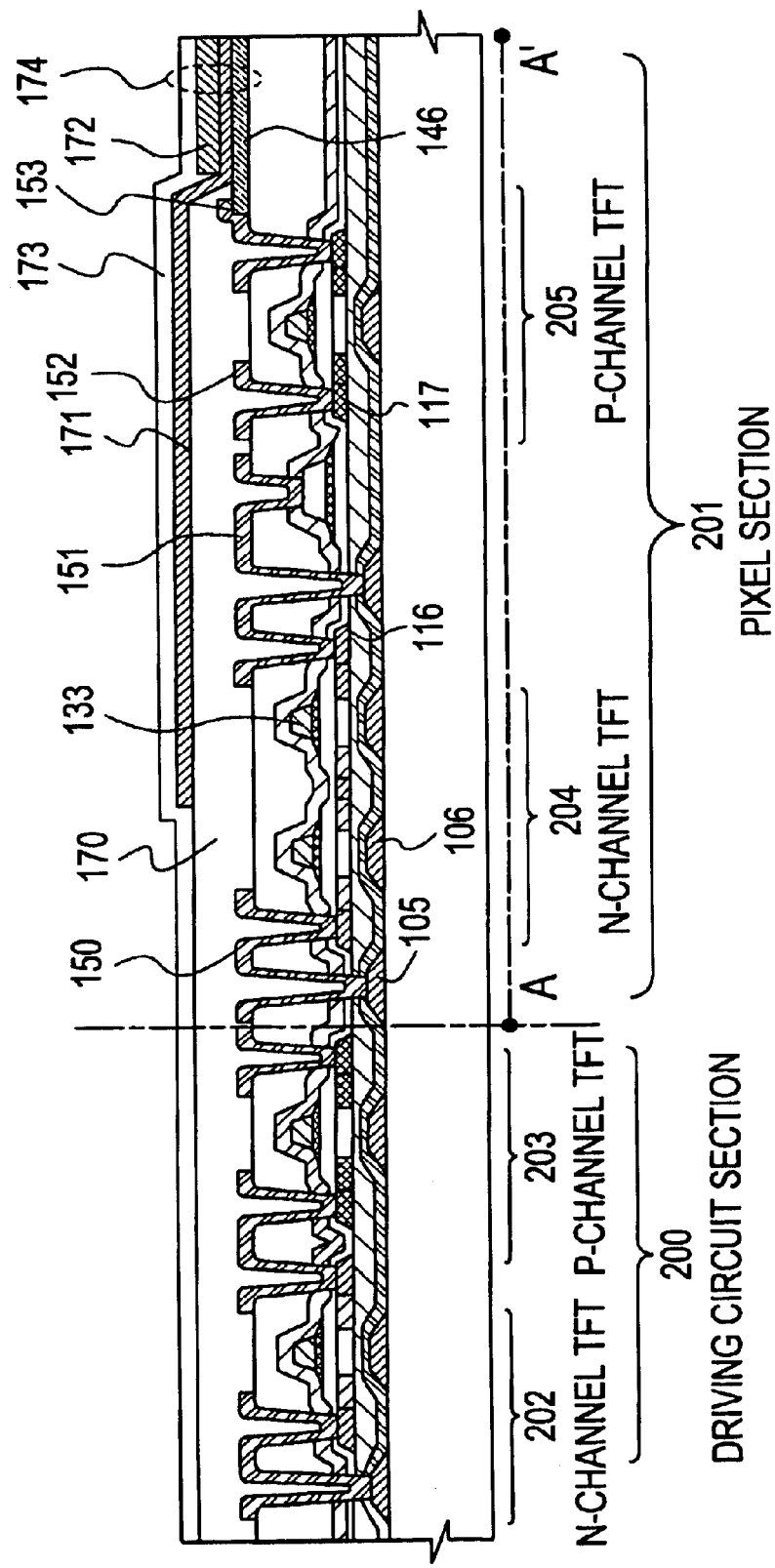
FIG. 6 is a sectional view for explaining the steps of manufacturing the driving circuit section and the pixel section in the luminous device.
Figure 7A:
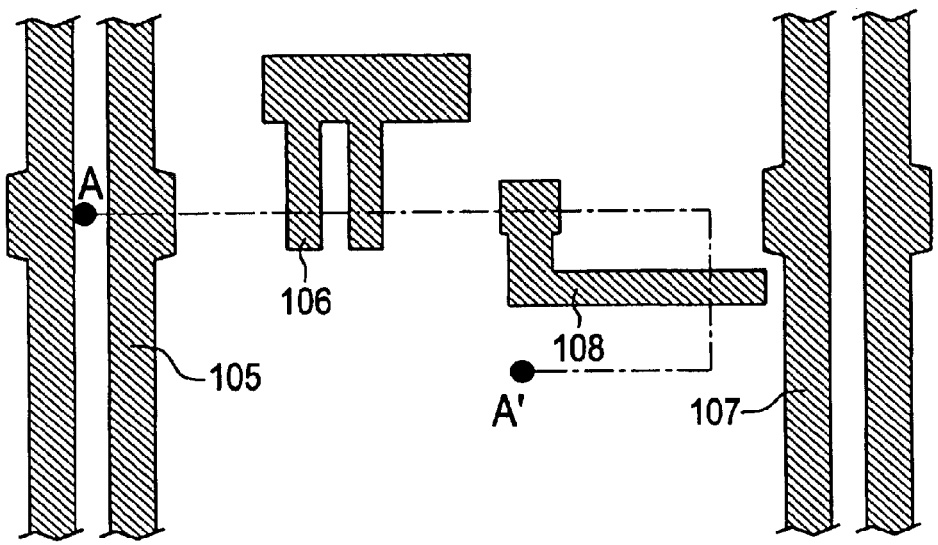
FIGS. 7A and 7B are top views for explaining the step of manufacturing the pixel section of the luminous device.
Figure 7B:
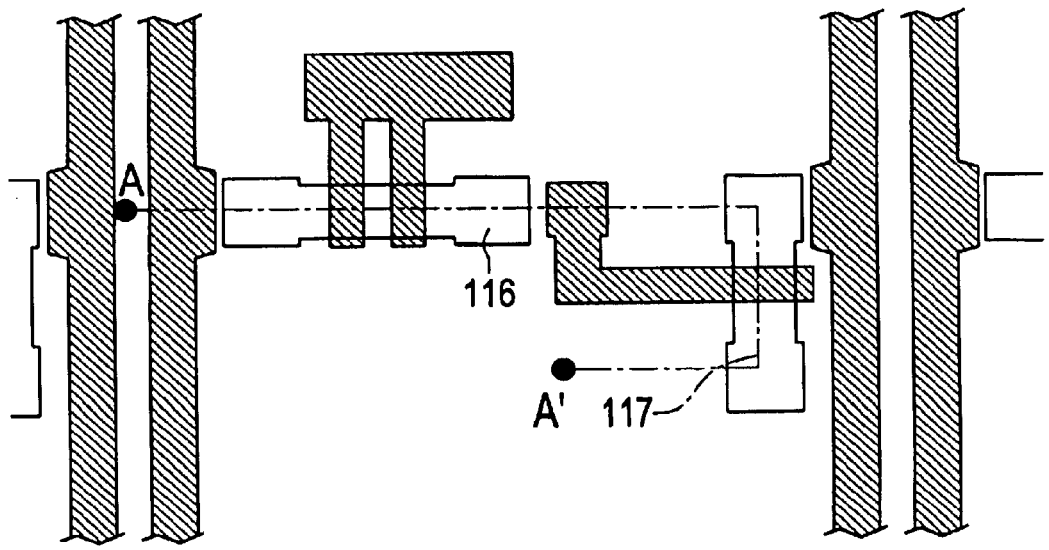

The pixel section 201 has a construction which can be applied to a luminous device in an active matrix driving manner. FIG. 6 illustrates a state that a luminous element formed on the fourth insulating film. A partition layer 170 covering the n-channel type TFT 204 and the p-channel type TFT 205 is formed on the fourth insulating film. Since the organic compound layers and the cathodes cannot be subjected to wet treatment (treatment such as etching with a chemical liquid, or water-washing), the partition layer 170 made of a photosensitive resin material is formed on the fourth insulating film, so as to match with the third electrode 146. For the formation of the partition layer 170, an organic resin material such as polyimide, polyamide, polyimide amide or acrylic polymer is used. This partition layer 170 is formed to cover edges of the third electrodes. Edges of the partition layer 170 are formed to be tapered at an angle of 45 to 60 degrees.

FIG. 9 illustrates a top view of the pixel section in this state. In FIG. 9, the partition layer 170 is formed in areas surrounded by dotted lines.

The luminous device in an active matrix driving manner, illustrated herein, is composed of organic luminescent elements arranged in a matrix form. Each of the organic luminescent elements 174 is composed of an anode, a cathode, and an organic compound layer formed therebetween. In the case that the third electrode 146 is made of a transparent conductive film, the electrode is an anode. The organic compound layer is formed by combining a hole transporting material having a relatively high hole mobility, an electron transporting material opposite thereto, a luminescent material, and so on. They may be produced into the form of layers, or produced into the form of mixed materials.

Even if the organic materials are combined, they are formed into a thin film having a thickness of about 100 nm. For this purpose, it is necessary to heighten the flatness of the surface of ITO formed as the anode. In the case that the flatness is bad, a short circuit is generated between the organic compound layer and the cathode formed on the organic compound layer if things come to the worst. To prevent this, a method of forming an insulating film 508 having a thickness of 1 to 5 nm may be adopted. As the insulating film 508, there may be used polyimide, polyimide amide, polyamide, acrylic polymer or the like. The fourth electrode 172 can be made up to a cathode, using an alkali metal or an alkali earth metal such as MgAg or LiF, or the like material.

For the fourth electrode 172, a material containing magnesium (Mg), lithium (Li) or calcium (Ca), which has a small work function is used. An electrode made of MgAg (material wherein Mg and Ag are mixed with each other (Mg:Ag=10:1)) is preferably used. Besides, a MgAg Al electrode, a LiAl electrode, or a LiFAl electrode may be used. Thereon is formed an insulating film 173 made of silicon nitride or DLC to have a thickness of 2 to 30 nm, preferably 5 to 10 nm. The DLC film can be formed by plasma CVD. Even if the DLC film is formed at a temperature of 100° C. or less, the film can cover edges of the partition layer 170 satisfactorily. Stress inside the DLC film can be relieved by incorporating a very small amount of argon thereto. The DLC film can be used as a protective film. Since the DLC film has a high gas-barrier property against CO, $CO_2$, $H_2O$ and the like gas, the DLC film is suitable for the insulating film 173 used as a barrier film.

Figure 15:
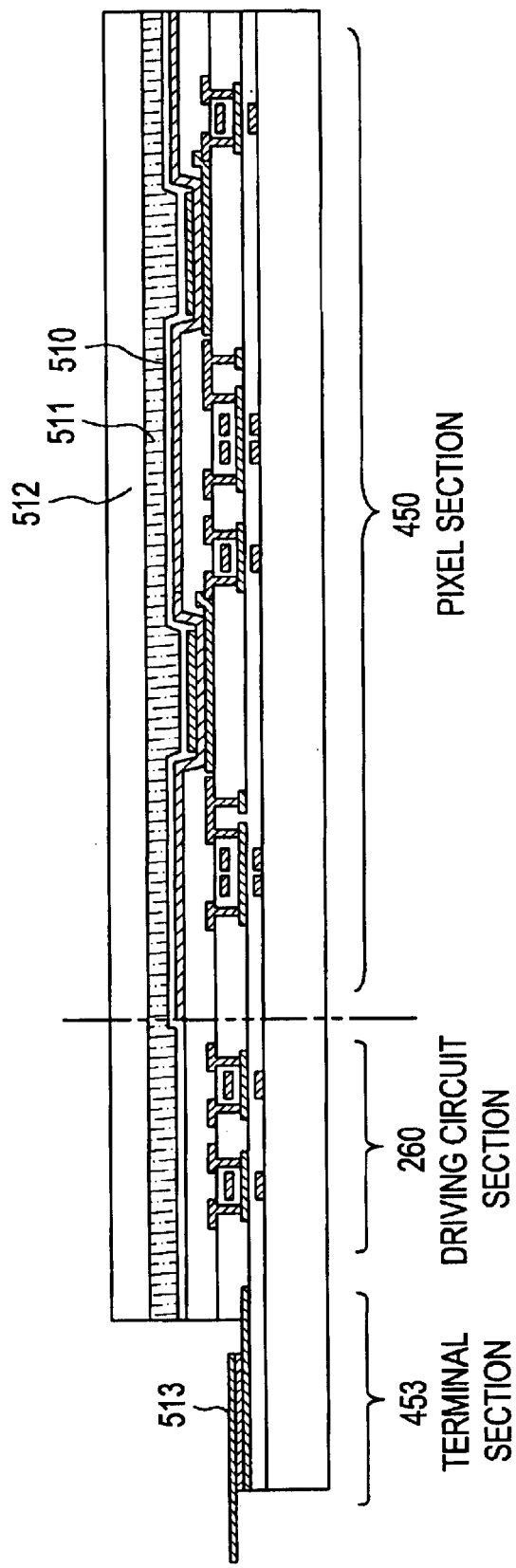
FIG. 15 is a sectional view illustrating the construction of a luminous device.

FIG. 15 is a view illustrating the construction of a luminous device having such a pixel section 450. An organic resin 512 is charged on an insulating film 511 formed on the pixel section 450, to seal a substrate 513 airtightly. A sealing member 515 may be fitted to edges thereof to make the air-tightness thereof higher. A flexible print circuit (FPC) is fitted to a terminal section 453.

Figure 16:
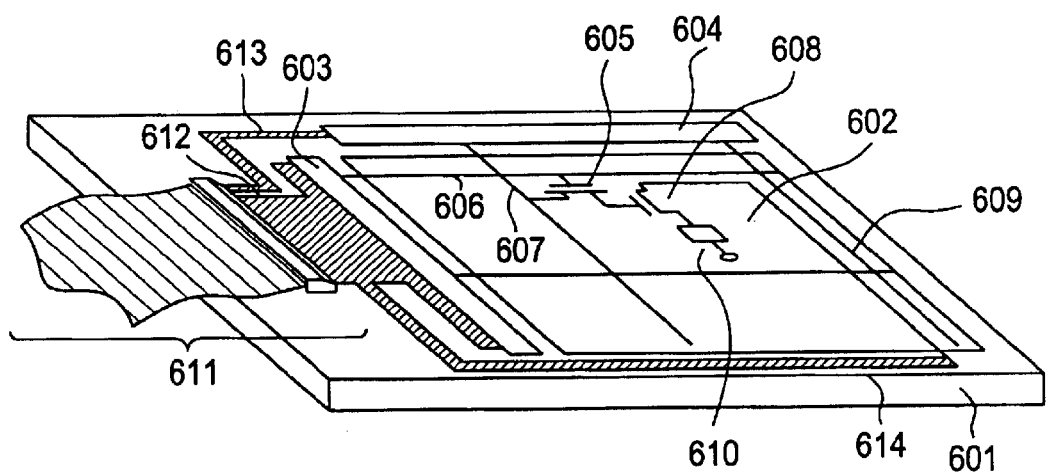
FIG. 16 is a perspective view for explaining the construction of a substrate on which a pixel section and a driving circuit section are formed.

The construction of the active matrix type luminous device of the present example will be described, referring to FIG. 16, which is a perspective view. The active matrix driving type luminous device of the present example is composed of a pixel section 602, a scanning line driving circuit 603 and a data line driving circuit 604, which are formed on a glass substrate 601. A switching TFT 605 in the pixel section is an n-channel type TFT, and is arranged at a point where a gate interconnection 606 connected to the scanning line driving circuit 603 crosses a source interconnection 607 connected to the data line driving circuit 604. The drain region of a switching TFT 605 is connected to the gate of a current-controlling TFT 608.

Furthermore, the data line side of the current-controlling TFT 608 is connected to a power supplying line 609. Grounding voltage (earth voltage) is applied to the power supplying line 609. An organic luminescent element 610 is connected to the drain region of the current-controlling TFT 608. A given voltage (10 to 12 V in the present example) is applied to the cathode of the organic luminescent element 610.

Input/output interconnections (connecting interconnections) 612 and 613 for transmitting signals to the driving circuit and an input/output interconnection 614 connected to the power supplying line 609 are fitted to an FPC 611, which becomes external input/output terminals. As described above, aluminous device wherein the TFTs and the organic luminous device are combined with each other can be completed.

Example 2

Figure 12A:
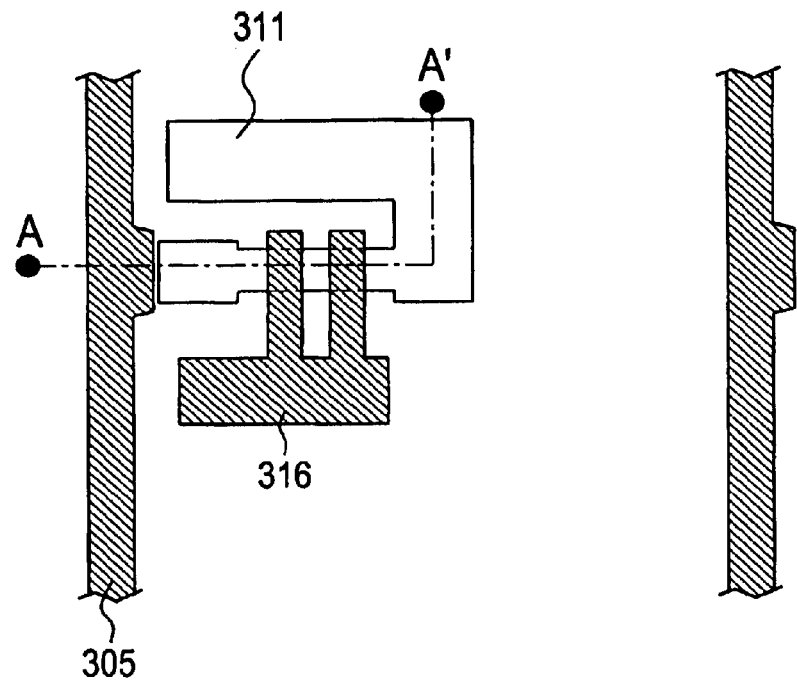
FIGS. 12A and 12B are top views for explaining the step of manufacturing the pixel section of the liquid crystal display device.
Figure 12B:
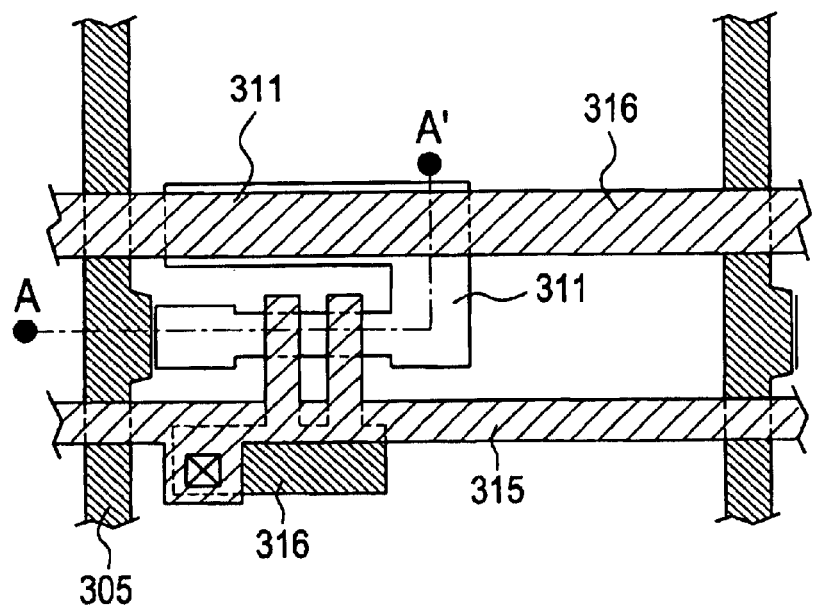
Figure 13:
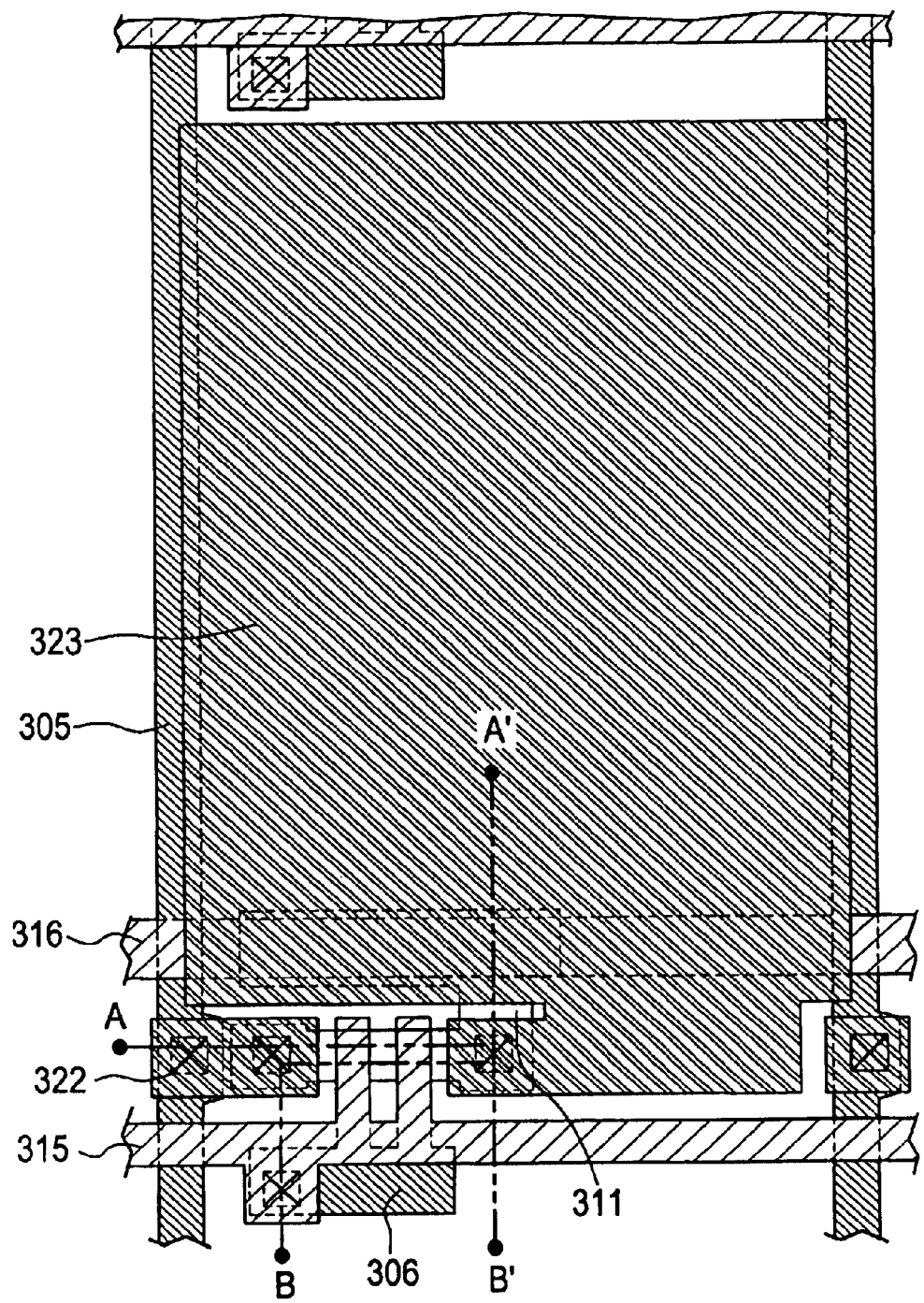
FIG. 13 is a top view for explaining the construction of the pixel section of the liquid crystal display device.

Another embodiment of the present invention will be described, referring to drawings. One example of the construction of a pixel construction and a driving circuit suitable for a liquid crystal display device will be described. FIGS. 10 and 11, which are referred to in the present embodiment, are sectional views for explaining the process of the manufacture thereof. FIGS. 12 and 13 are top views corresponding thereto. In the following description, common reference numbers are used for convenience.

In FIG. 10A, a substrate 301, first interconnections 302 to 306, and semiconductor films 310 to 312 divided into an island form are the same as in Embodiment 1. FIG. 12A illustrates atop view thereof in this state.

First, a first insulating film 307 of a silicon oxynitride film is formed to have a thickness of 50 nm. A silicon oxide film made by TEOS is used to form a second insulating film 308 of 1 μm thickness. The surface is made flat by CMP, and subsequently a silicon oxynitride film 309 is formed as a third insulating film 309, to produce a three-layer structure. Of course, the same structure as in Embodiment 1 may be used.

Next, as illustrated in FIG. 10B, a third insulating film 313a covering semiconductor films 310 to 312 is formed. The third insulating film 313a is made of an insulator containing silicon by plasma CVD or sputtering. The thickness thereof is from 40 to 150 nm.

Second interconnections 313b and 314 to 316 are formed thereon. The material of the second interconnections is not limited, and the interconnections are composed of a first layer made of a nitride of a high melting point metal such as molybdenum or tungsten, and a high melting point metal, a low-resistance metal such as aluminum or copper, polysilicon or the like, which is formed on the first layer. Specifically, for the first layer a nitride of one or more selected from W, Mo, Ta and Ti is selected, and for the second layer an alloy of one or more selected from W, Mo, Ta, Ti, Al and Cu, or an n-type polycrystal silicon is used. FIG. 12B illustrates atop view of this state.

Thereafter, impurity regions are formed in the respective semiconductor films by ion doping in the same way as in Embodiment 1. Furthermore, heat treatments for activation and hydrogenation are performed. In the heat treatments, it is advisable to use the RTA method in a gas-heating manner.

A passivation film 317 made of a silicon nitride film and a fifth insulating film 318 made of an organic resin material such as acrylic polymer, polyimide, polyamide, and polyimide amide are formed. This lamination is a fourth insulating film. The surface of the fourth insulating film is desirably made flat by CMP. Thereafter, openings are made and then interconnections 319 to 322 and a pixel electrode 323 are formed.

In this way, a driving circuit section 400 having an n-channel type TFT 402 and a p-channel type TFT 403 and a pixel section 401 having an n-channel type TFT 404 and a p-channel type TFT 405 are formed.

In the n-channel type TFT 402 of the driving circuit section 400, a channel formed region 330 is formed at a portion where the first interconnection 303 crosses the second interconnection 313b in the semiconductor film 310. A one-conduction-type impurity region 334 having a second concentration functions as an LDD, and a one-conduction-type impurity region 335 having a first concentration functions as a source or drain region. The length, in the channel length direction, of the LDD is from 0.5 to 2.5 μm, preferably 1.5 μm. A main purpose of such a construction of the LDD is to prevent deterioration of the TFTs based on hot carrier effect. In the p-channel type TFT 403, a channel formed region 331 is formed at a portion where the first interconnection 304 crosses the second interconnection 314 in the semiconductor film 310. An impurity region 336 of a conduction-type reverse to the one-conduction-type, which has a third concentration, functions as a source or drain region. The n-channel type TFT and the p-channel type TFT can constitute a shift register circuit, a buffer circuit, a level shifter circuit, a latch circuit or the like. The construction of the first n-channel type TFT 402 is particularly suitable for a buffer circuit having a high driving voltage, in order to prevent the deterioration based on hot carrier effect.

The present invention can be applied to a circuit made basically of an NMOS or a PMOS, as well as a circuit made of the CMOS.

In the n-channel type TFT 404 of the pixel section 401, a channel formed region 330 is formed at a portion where the first interconnection 306 crosses the second interconnection 315 in the semiconductor film 312. A one-conduction-type impurity region 337 having the second concentration functions as an LDD, and a one-conduction-type impurity region 338 having the first concentration functions as a source or drain region. This n-channel type TFT 404 is in a form wherein two TFTs are connected to each other in series so as to sandwich the one-conduction-type impurity region having the first concentration.

In the pixel section 401, a capacitor section connected to the n-channel type TFT 404 is composed of the semiconductor film 312, the third insulating film and a second interconnection 315.

FIG. 13 illustrates a top view of the pixel section in this state. Line A–A' corresponds to FIG. 11A. Line B–B' corresponds to FIG. 11B.

As described above, in the present invention, a pair of gate electrodes is formed to sandwich a semiconductor film, whereby the thickness of the semiconductor film is made substantially half and further depletion advances rapidly with the application of gate voltage to increase electric field effect mobility. The sub-threshold coefficient can be made low.

Figure 14:
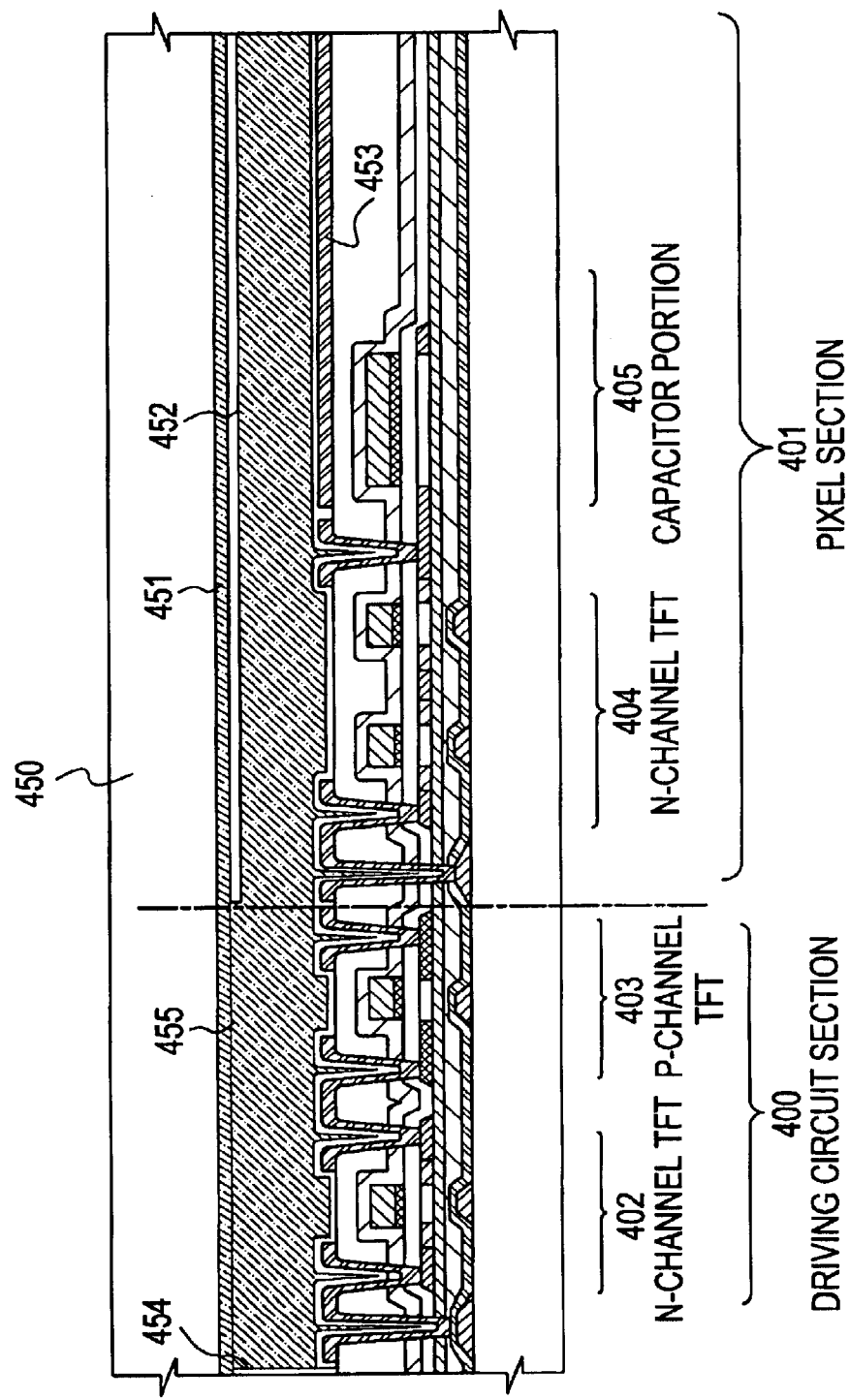
FIG. 14 is a sectional view for explaining the construction of the liquid crystal display device.

After the formation of the construction illustrated in FIG. 11A, an oriented film 453 is formed and subjected to rubbing treatment, as illustrated in FIG. 14. Before the formation of the oriented film 383, columnar spacers for keeping a substrate interval may be formed at desired positions by patterning an organic resin film such as an acrylic resin film, which is not illustrated. Spherical spacers may be scattered onto the entire surface of the substrate, instead of the columnar spacers.

Next, a counter electrode 451 is formed on a counter substrate 450. An oriented film 452 is formed thereon and subjected to rubbing treatment. The counter electrode 451 is made of ITO. A counter substrate 450 on which a seal pattern 454 is formed is adhered thereto. Thereafter, a liquid crystal material 455 is injected into the space between both of the substrates, and then the space is completely sealed with a sealant (not illustrated). As the liquid crystal material, any known liquid crystal material may be used. In this way, an active matrix driving type liquid crystal display device illustrated in FIG. 14 is completed.

Example 3

Figure 17:
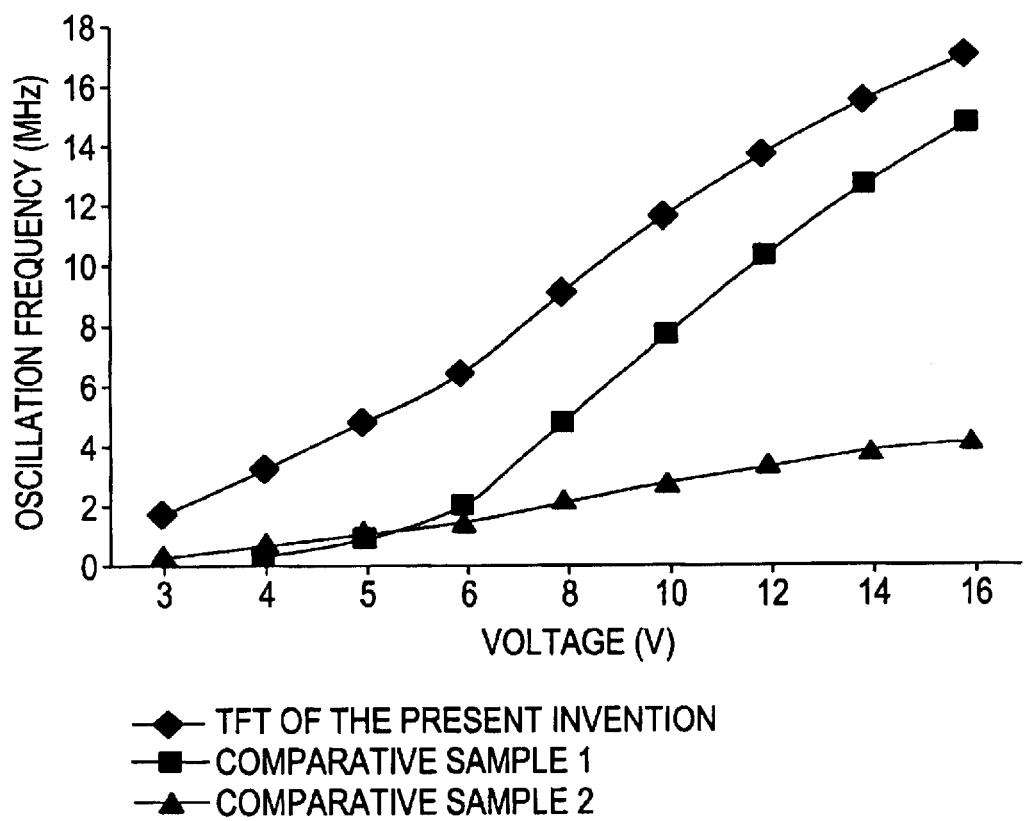
FIG. 17 is a graph showing the oscillation frequency characteristic of a ring oscillator circuit against driving voltage.

FIG. 17 shows the characteristic of a 19-stage ring oscillator, which is an example of the operation characteristic of TFTs manufactured by the present invention. About the sizes of the TFTS, the channel length (L) and the channel width (W) of the n-channel type TFT are 5 μm and 10 μm, respectively, and the channel length (L) and the channel width (W) of the p-channel type TFT are 5 μm and 20 μm, respectively. The TFTs of the present invention are manufactured according to Example 1. First electrodes and second electrodes are formed along the up-and-down direction, to sandwich a semiconductor film to produce gate electrodes. Edges thereof are substantially aligned with each other.

Comparative sample 1 is composed of conventional TFTS, wherein first electrodes (gate electrodes) are formed on one side of a semiconductor film. Comparative sample 2 is a product wherein first electrodes and second electrodes are formed along the up-and-down direction to sandwich a semiconductor film to produce gate electrodes and one of the two kinds of electrodes is formed to overlap with the entire surface of the semiconductor film.

FIG. 17 is a graph wherein oscillation frequency against driving voltage is plotted. In the TFTs of the present invention, a higher oscillation frequency can be obtained at a low voltage than in Comparative samples 1 and 2. The advantageous effect is remarkable. This indirectly demonstrates the fact that the sub-threshold coefficient of the TFTs became smaller. The superiority of the present invention is actually shown. It is considered that in Comparative sample 2, its oscillation frequency is lowered by parasitic capacitance.

As described above, a pair of gate electrodes is formed to sandwich a semiconductor film, whereby the thickness of the semiconductor is made substantially half and further depletion advances rapidly with the application of gate voltage to increase electric field effect mobility. The sub-threshold coefficient can be made low. As a result, using a TFT having this construction, the driving voltage thereof can be lowered. Moreover, the current driving ability thereof is improved and the size (particularly the channel width) of the TFT can be made small. Therefore, the integration density can be improved.

What is claimed is:

1. A method for manufacturing a semiconductor device, comprising the steps of:
    forming a first electrode and a first interconnection over an insulating surface;
    forming a first insulating film and a second insulating film over the first electrode and the first interconnection,
    flattening a surface of the second insulating film by chemical-mechanical polishing;
    forming a semiconductor film over the flattened surface of the second insulating film;
    forming a third insulating film over the semiconductor film;
    making an opening in the first to third insulating films;
    exposing a part of the first electrode by the opening;
    forming a second electrode and a second interconnection over the third insulating film; and
    connecting the first electrode and the second electrode to each other through the opening.

2. A method according to claim 1, wherein an edge of the first electrode and an edge of the second electrode are substantially aligned with each other at a cross portion of the electrodes and the semiconductor film.

3. A method for manufacturing a semiconductor device, comprising the steps of:
    forming a first electrode and a first interconnection over an insulating surface;
    forming a first insulating film and a second insulating film over the first electrode and the first interconnection;
    making the second insulating film flat by chemical-mechanical polishing;
    forming a semiconductor film over the second insulating film;
    forming a third insulating film over the semiconductor film;
    making a first opening in the first to third insulating films;
    exposing a part of the first electrode by the first opening;
    forming a second electrode and a second interconnection over the third insulating film;
    connecting the first electrode and the second electrode to each other through the first opening;
    forming a fourth insulating film over the second electrode and the second interconnection;
    making a second opening in the first to fourth insulating films;
    exposing a part of the first interconnection by the second opening;
    making a third opening in the third and fourth insulating films;
    exposing a part of the semiconductor film by the third opening;
    forming a third electrode on the fourth insulating film; and
    connecting the first interconnection and the semiconductor film to each other through the second opening and the third opening.

4. A method according to claim 3, wherein an edge of the first electrode and an edge of the second electrode are substantially aligned with each other at a cross portion of the electrodes and the semiconductor films.

5. A method for manufacturing a semiconductor device, comprising the steps of:
    forming a first electrode and a first interconnection over an insulating surface;
    forming a first insulating film and a second insulating film over the first electrode and the first interconnection;
    making the second insulating film flat by chemical-mechanical polishing;
    forming a semiconductor film over the second insulating film;
    forming a third insulating film over the semiconductor film;
    making a first opening in the first to third insulating films;
    exposing a part of the first electrode by the first opening;
    forming a second electrode and a second interconnection over the third insulating film;
    connecting the first electrode and the second electrode to each other through the first opening,
    forming a pair of one-conduction-type impurity regions in the semiconductor film;
    forming a fourth insulating film over the second electrode and the second interconnection;
    making a second opening in the first to fourth insulating films;
    exposing a part of the first interconnection by the second opening;
    making a third opening in the third and fourth insulating films;
    exposing a part of one of the one-conduction-type impurity regions by the third opening;
    forming a third electrode over the fourth insulating film; and
    connecting the first interconnection and the one of the one-conduction-type regions to each other through the second opening and the third opening.

6. A method according to claim 5, wherein an edge of the first electrode and an edge of the second electrode are substantially aligned with each other at a cross portion of the electrodes and the semiconductor films.

* * * * *

UNITED STATES PATENT AND TRADEMARK OFFICE
CERTIFICATE OF CORRECTION

PATENT NO. : 6,982,194 B2  Page 1 of 9
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Sheet 3 of 17, replace Figure 3B with the following:

--

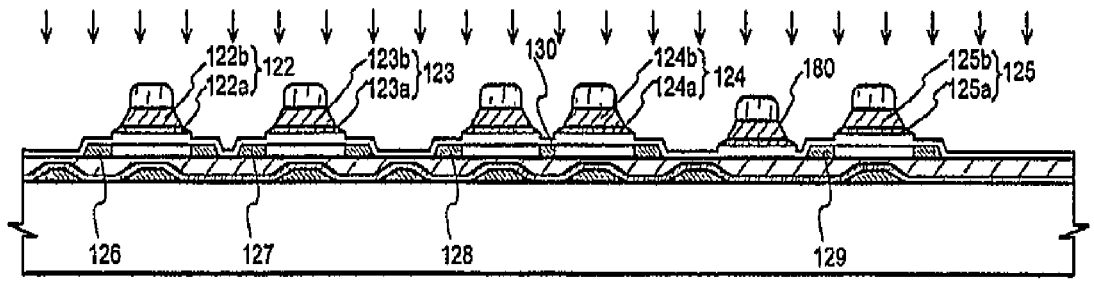

Sheet 4 of 17, replace Figure 4A with the following:

--

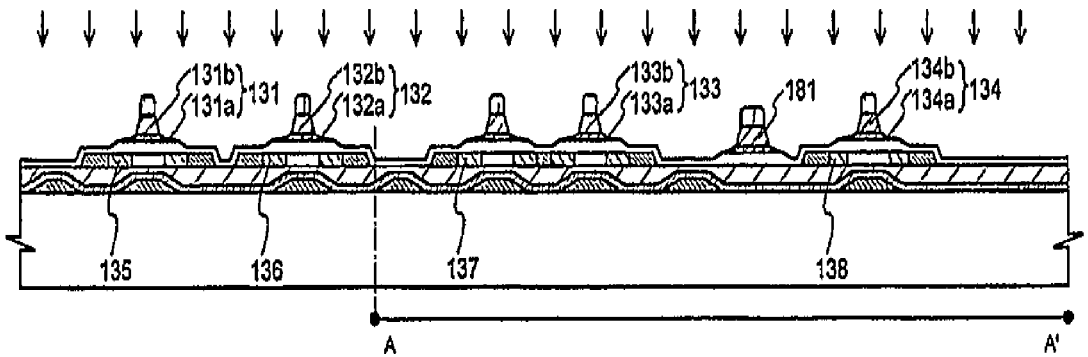

--

UNITED STATES PATENT AND TRADEMARK OFFICE
CERTIFICATE OF CORRECTION

PATENT NO.        : 6,982,194 B2
APPLICATION NO. : 10/125790
DATED              : January 3, 2006
INVENTOR(S)       : Akira Tsunoda et al.

It is certified that error appears in the above-identified patent and that said Letters Patent is hereby corrected as shown below:

Sheet 7 of 17, replace Figure 7A with the following:

--

FIG. 7A  FORMATION OF FIRST INTERCONNECTION

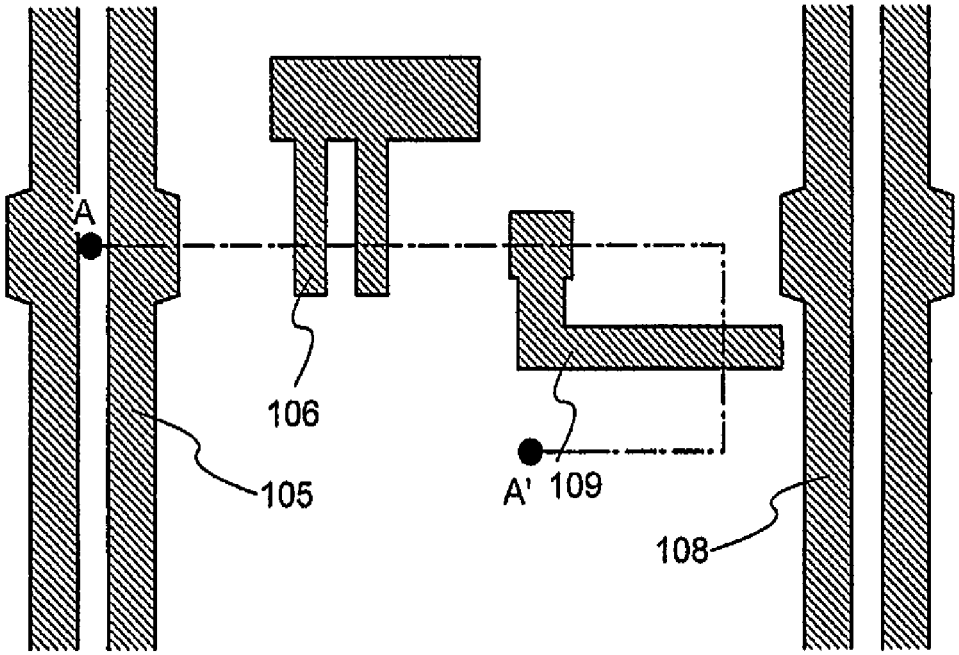

--

UNITED STATES PATENT AND TRADEMARK OFFICE
CERTIFICATE OF CORRECTION

PATENT NO. : 6,982,194 B2  Page 3 of 9
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Sheet 8 of 17, replace Figure 8A with the following:

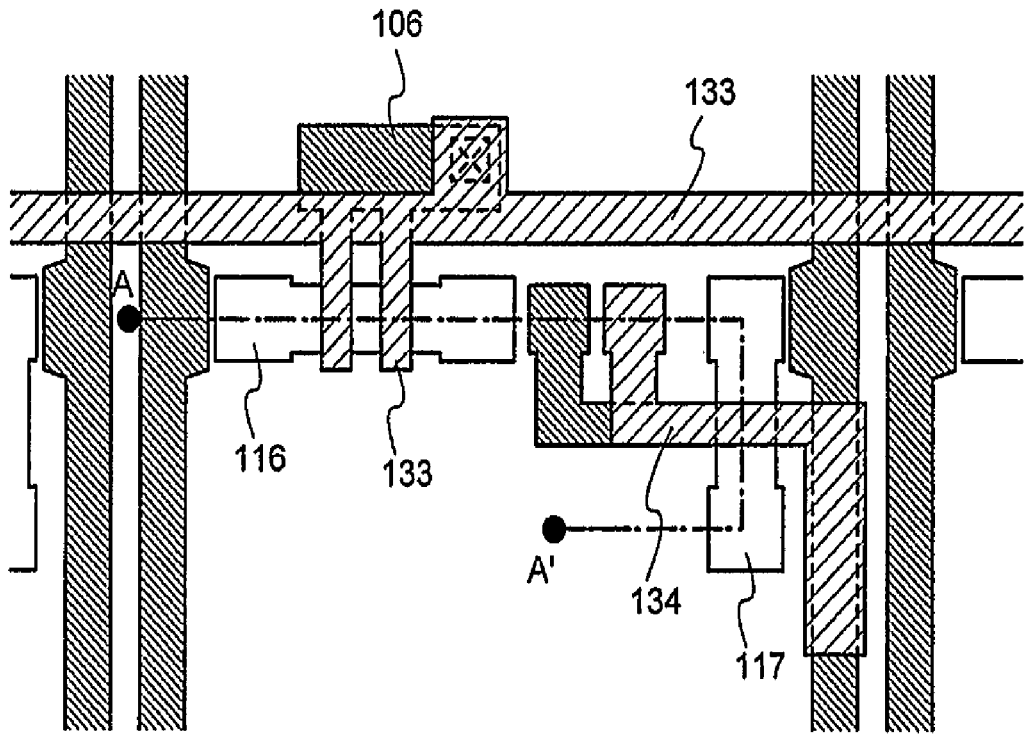

UNITED STATES PATENT AND TRADEMARK OFFICE
CERTIFICATE OF CORRECTION

| | | |
|---|---|---|
| PATENT NO. | : 6,982,194 B2 | Page 4 of 9 |
| APPLICATION NO. | : 10/125790 | |
| DATED | : January 3, 2006 | |
| INVENTOR(S) | : Akira Tsunoda et al. | |

It is certified that error appears in the above-identified patent and that said Letters Patent is hereby corrected as shown below:

Sheet 9 of 17, replace Figure 9 with the following:

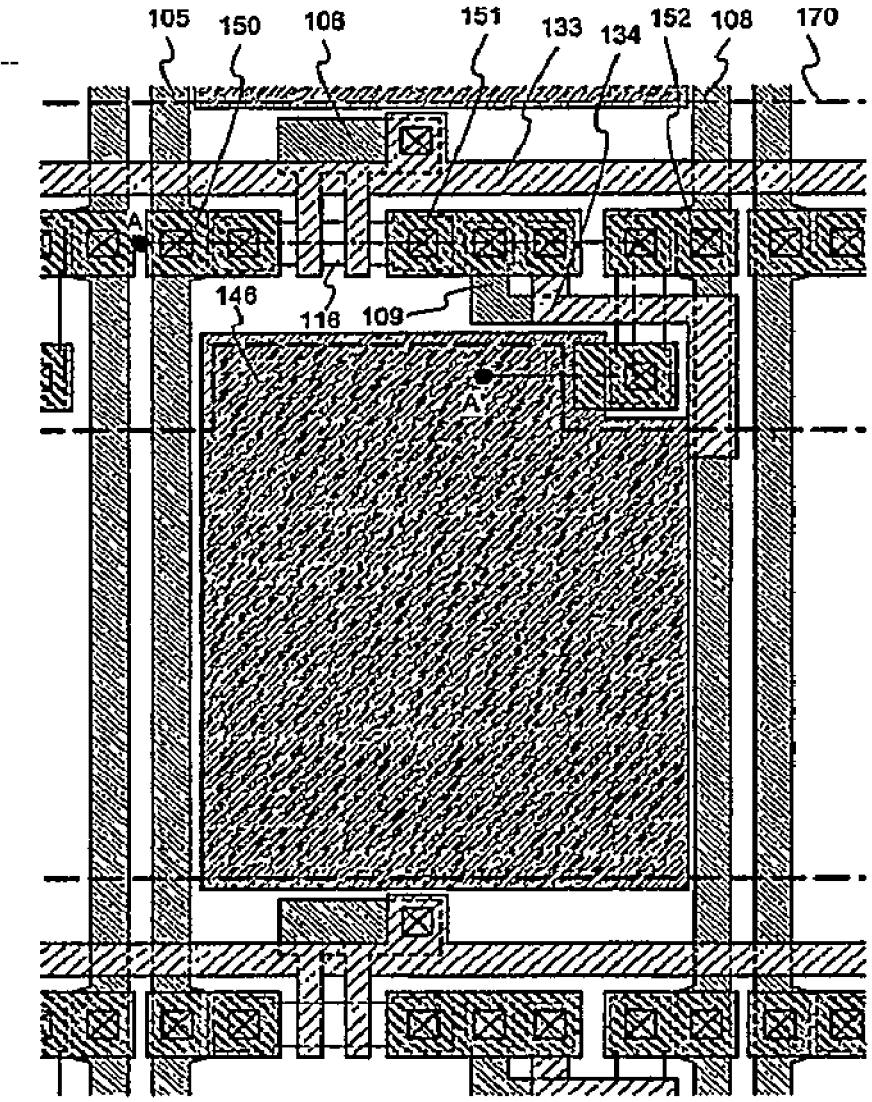

FIG. 9

UNITED STATES PATENT AND TRADEMARK OFFICE
CERTIFICATE OF CORRECTION

PATENT NO. : 6,982,194 B2  Page 5 of 9
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Sheet 12 of 17, replace Figure 12A with the following:

--

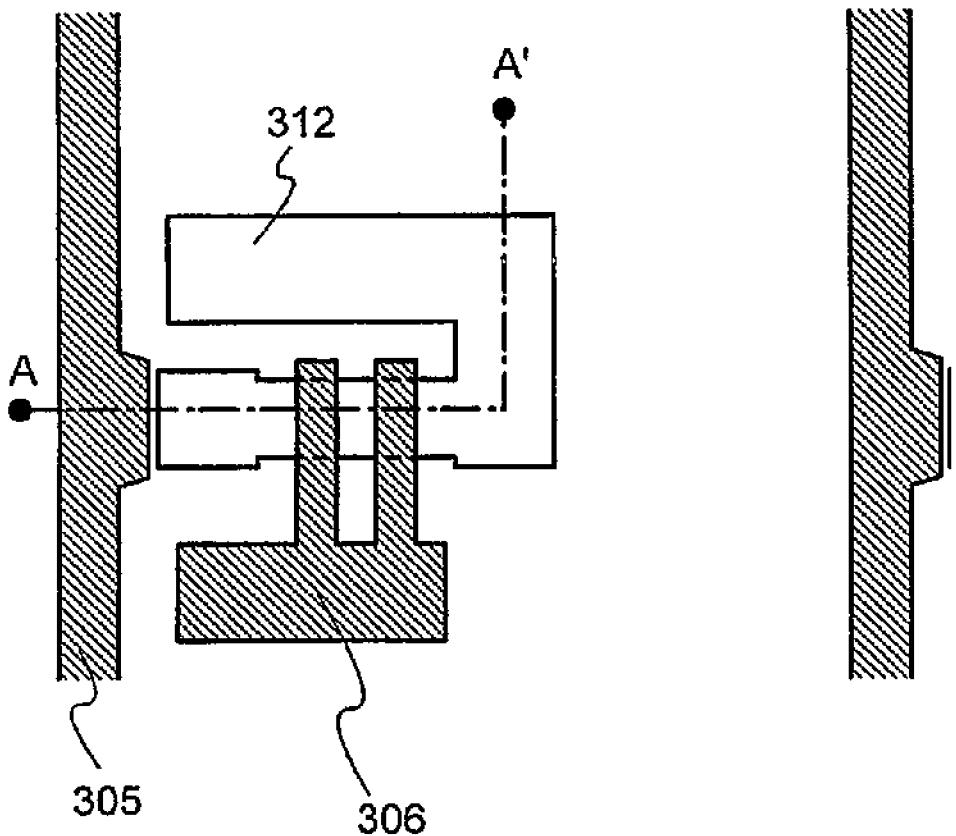

--

UNITED STATES PATENT AND TRADEMARK OFFICE
CERTIFICATE OF CORRECTION

| | |
|---|---|
| PATENT NO. | : 6,982,194 B2 |
| APPLICATION NO. | : 10/125790 |
| DATED | : January 3, 2006 |
| INVENTOR(S) | : Akira Tsunoda et al. |

It is certified that error appears in the above-identified patent and that said Letters Patent is hereby corrected as shown below:

Sheet 12 of 17, replace Figure 12B with the following:

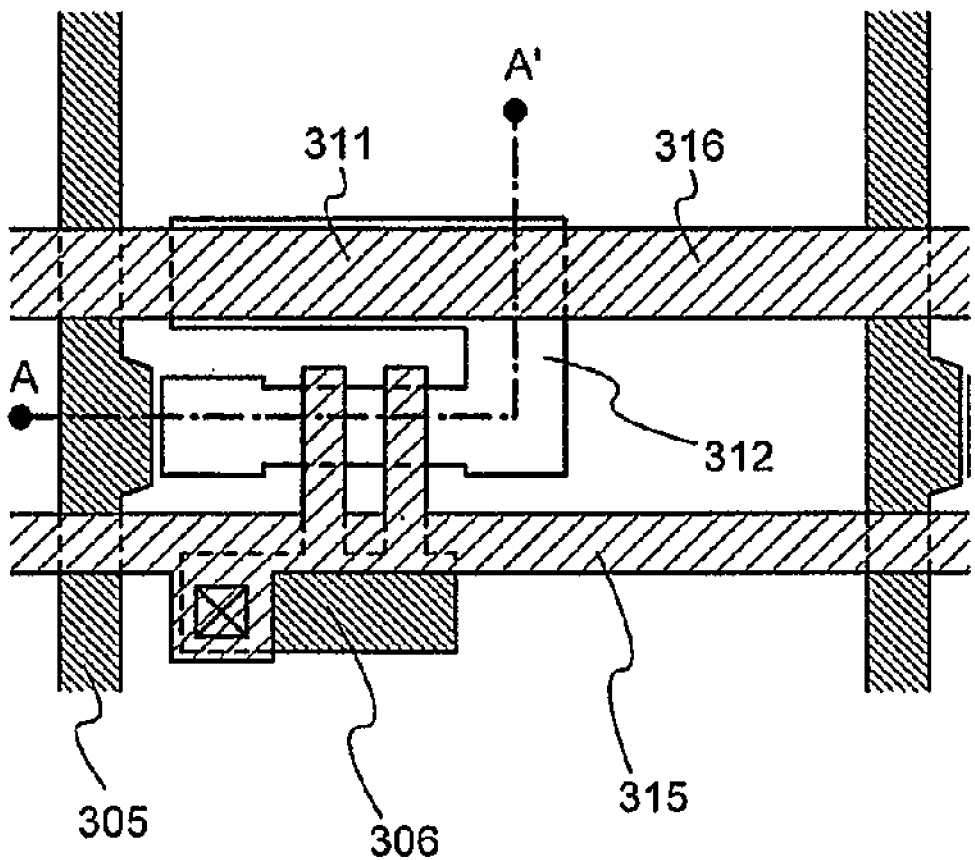

UNITED STATES PATENT AND TRADEMARK OFFICE
CERTIFICATE OF CORRECTION

PATENT NO. : 6,982,194 B2
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Column 2, line 17, replace "formed" with --forming--.

Column 3, lines 17-18, replace "the second interconnection" with --a second interconnection--; line 27, replace "films" with --film--.

Column 4, line 2, replace "up to" with --as--; line 4, replace "first and fourth" with --first to fourth--.

Column 6, lines 14 and 17, replace "layer" with --film--; lines 14 and 31, replace "12" with --13--; lines 28 and 54, replace "14" with --14$a$--; line 31, replace "first" with --second--; line 39, replace "15" with --14$b$--; line 40, replace "16" with --15--; line 44, replace "films" with --film--; lines 45 and 46, replace "formed" with --forming--.

Column 7, line 7, replace "15" with --14$b$--; line 16, replace "as in" with --in--; line 46, replace "2" with --2A--; line 48, replace "7" with --7A--; line 64, replace "107" with --108--; line 66, replace "108" with --109--.

Column 8, line 24, replace "first" with --second-- and "12" with --112--; line 37, replace "104 to 107" with --114 to 117--; line 48, replace "second" with --third--; line 64, replace "130" with --118--; line 65, replace "125" with --180--.

Column 9, line 5; replace "129" with --130--; line 26, replace "116" with --106--; line 27, replace "opening 109" with --opening--; line 59, replace "134" with --181--; lines 60-61, replace "interconnection 107" with --interconnection--.

UNITED STATES PATENT AND TRADEMARK OFFICE
CERTIFICATE OF CORRECTION

PATENT NO. : 6,982,194 B2
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Column 10, lines 10, 18 and 35, replace "third" with --fourth--; lines 16, 22, 27 and 36, replace "fourth" with --fifth--; line 31, replace "8A" with --8B--; line 35, replace "4th" with --5th--; lines 48, 54 and 67, replace "constitutes" with --sandwiches--; lines 49 and 54, replace "formed" with --forming--.

Column 11, line 1, replace "formed" with --forming--; lines 24, 26 and 31, replace "fourth" with --fifth--; lines 60 and 62, replace "insulating film 508" with --insulating film--; line 63, replace "The" with --A--.

Column 12, line 16, replace "and the like gas" with --and the like--; line 22, replace "member 515" with --member--; line 61, replace "10 and 11" with --10A to 11B--; line 63, replace "12 and 13" with --12A to 13--.

Column 13, lines 11 and 13, replace "third" with --fourth--; lines 36 and 37, replace "fourth" with --fifth--; lines 46 and 57, replace "formed" with --forming--; line 59, replace "310" with --311--.

UNITED STATES PATENT AND TRADEMARK OFFICE
CERTIFICATE OF CORRECTION

PATENT NO. : 6,982,194 B2
APPLICATION NO. : 10/125790
DATED : January 3, 2006
INVENTOR(S) : Akira Tsunoda et al.

It is certified that error appears in the above-identified patent and that said Letters Patent is hereby corrected as shown below:

Column 14, line 5, replace "formed" with --forming-- and replace "330" with --332--; line 17, replace "third" with --fourth--; line 18, replace "315" with --316--; line 32, replace "383" with --453--.

Signed and Sealed this

Twenty-sixth Day of June, 2007

JON W. DUDAS
*Director of the United States Patent and Trademark Office*